(12) United States Patent
De et al.

(10) Patent No.: US 7,416,821 B2
(45) Date of Patent: Aug. 26, 2008

(54) THERMALLY CURED UNDERCOAT FOR LITHOGRAPHIC APPLICATION

(75) Inventors: Binod B De, Attleboro, MA (US); Sanjay Malik, Attleboro, MA (US); J. Thomas Kocab, Piermont, NH (US); Thomas Sarubbi, East Greenwich, RI (US)

(73) Assignee: Fujifilm Electronic Materials, U.S.A., Inc., North Kingstown, RI (US)

( * ) Notice: Subject to any disclaimer, the term of this patent is extended or adjusted under 35 U.S.C. 154(b) by 255 days.

(21) Appl. No.: 11/075,518

(22) Filed: Mar. 9, 2005

(65) Prior Publication Data
US 2005/0238997 A1  Oct. 27, 2005

Related U.S. Application Data

(60) Provisional application No. 60/552,489, filed on Mar. 12, 2004.

(51) Int. Cl.
*G03C 3/00* (2006.01)

(52) U.S. Cl. .................. 430/15; 430/270.1; 430/271.1; 430/312; 430/327; 430/909; 430/910; 430/927; 522/50; 522/57; 522/59; 522/132; 522/146; 522/152

(58) Field of Classification Search ................ 430/909, 430/910, 927, 271.1, 327, 270.1, 964, 15, 430/312; 522/50, 57, 59, 146, 132, 152; 525/132, 152
See application file for complete search history.

(56) References Cited

U.S. PATENT DOCUMENTS

| | | | |
|---|---|---|---|
| 4,251,665 A | 2/1981 | Calbo | |
| 5,187,019 A | 2/1993 | Calbo et al. | |
| 5,488,182 A | 1/1996 | Kobayashi et al. | |
| 5,514,755 A | 5/1996 | Fenn et al. | |
| 6,054,248 A | 4/2000 | Foster et al. | |
| 6,316,165 B1 | 11/2001 | Pavelchek et al. | |
| 6,399,269 B2 | 6/2002 | Mizutani et al. | |
| 6,472,128 B2 | 10/2002 | Thackeray et al. | |
| 6,514,663 B1* | 2/2003 | Hien et al. | ............. 430/270.1 |
| 6,610,808 B2 | 8/2003 | De et al. | |
| 6,696,219 B2 | 2/2004 | Yasunami et al. | |
| 6,777,161 B2* | 8/2004 | Yasunami et al. | ........ 430/270.1 |
| 6,783,916 B2 | 8/2004 | Foster et al. | |
| 6,808,869 B1 | 10/2004 | Mizutani et al. | |
| 6,855,466 B2 | 2/2005 | Pavelchek et al. | |
| 6,906,226 B2 | 6/2005 | Matsuishi et al. | |
| 6,924,339 B2 | 8/2005 | De et al. | |
| 2003/0027078 A1* | 2/2003 | Kang et al. | ............. 430/270.1 |

FOREIGN PATENT DOCUMENTS

| | | |
|---|---|---|
| EP | 1172695 | 1/2002 |
| EP | 0942331 | 11/2003 |
| EP | 0987600 | 11/2003 |

\* cited by examiner

*Primary Examiner*—Richard Schilling
(74) *Attorney, Agent, or Firm*—Ohlandt, Greeley, Ruggiero & Perle, LLP

(57) ABSTRACT

Thermally curable undercoat composition comprising for producing a bilayer relief image comprising:
  a) a polymer of Structure I comprising repeating units of Structure II, III, and IV

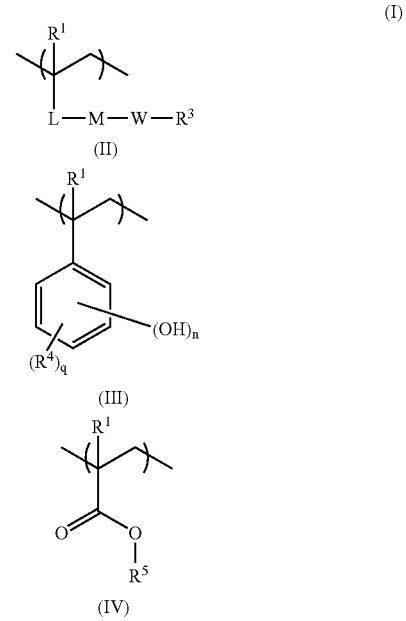

b) a phenolic crosslinker;
  c) a thermal acid generator (TAG); and
  d) a solvent.

24 Claims, No Drawings

THERMALLY CURED UNDERCOAT FOR LITHOGRAPHIC APPLICATION

RELATED APPLICATIONS

This application claims priority from U.S. Provisional Patent Application No. 60/552,489 filed Mar. 12, 2004.

FIELD OF THE INVENTION

The present invention relates to deep UV lithography used in semiconductor manufacturing and more particularly to undercoat layers for chemically amplified bilayer resist systems.

BACKGROUND TO THE INVENTION

Integrated circuit production relies on the use of photolithographic processes to define the active elements and interconnecting structures on microelectronic devices. Until recently, g-line (436 nm) and I-line (365 nm) wavelengths of light have been used for the bulk of microlithographic applications. However, in order to achieve smaller dimensions of resolution, the wavelength of light used for microlithography in semiconductor manufacturing has been reduced into the deep UV regions of 254 nm and 193 nm. As the patterns and wavelengths become finer, the materials properties of the photoresists used for pattern delineation have become more and more demanding. In particular, requirements of sensitivity, transparency, aesthetics of the image produced, and the selectivity of the resists to etch conditions for pattern transfer become more and more strenuous. The problem with using deep UV wavelengths is that resists used at the higher wavelengths were too absorbent and insensitive. Because of this, the traditional lithographic materials, such as novolaks, diazonaphthoquinones, etc., are unsuitable platforms for ultra large-scale integration (ULSI) manufacture and beyond. Thus, in order to utilize deep UV light wavelengths, new resist materials with low optical absorption and enhanced sensitivities were needed along with additional lithographic techniques.

Advanced photoresists usually employ a technique called chemical amplification in which an acid generated by photolysis catalyzes a solubility switch from alkali insoluble to alkali soluble by removal of an acid sensitive group protecting an alkali-solubilizing moiety. The principle of chemical amplification as a basis for photoresist operation has been known for some years (see U.S. Pat. No. 4,491,628). Most chemically amplified resists have been designed around the use of acid sensitive carboxylic esters or acid sensitive hydroxystyrene derivatives.

However, chemically amplified resist systems have many shortcomings. One problem is standing wave effects, which occur when monochromatic is reflected off the surface of a reflective substrate during exposure. The formation of standing waves in the resist reduces resolution and causes linewidth variations. For example, standing waves in a positive resist have a tendency to result in a foot at the resist/substrate interface reducing the resolution of the resist.

In addition, chemically amplified resist profiles and resolution may change due to substrate poisoning. Particularly, this effect occurs when the substrate has a nitride layer. It is believed that residual N—H bonds in the nitride film deactivates the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 μm or lower, to print sub 0.18 μm features. This in turn requires the resist to have excellent plasma etch resistance such that resist image features can be transferred down into the underlying substrate. However, in order to decrease absorbance of the chemically amplified resist, aromatic groups, such as those in novolaks had to be removed, which in turn decreased the etch resistance.

The most common type of photoresists are called "single layer" photoresists in which the photoresist has both the function of imaging and plasma etch resistance. Single layer resists use anti-reflective coatings to minimize standing wave problems, which also assists in decreasing problems with substrate poisoning. However, there are distinct performance tradeoffs between resist absorbance, image profiles, resolution and substrate plasma etch resistance which are not optimum for all semiconductor processes.

Utilizing an underlayer or undercoat film that is placed on the substrate before the chemical amplified resist film is applied can reduce the above-mentioned problems and break the performance tradeoffs described above. The undercoat absorbs most of the deep UV light attenuating standing wave effects. In addition, the undercoat prevents deactivation of the acid catalyst at the resist/substrate interface. Furthermore, the undercoat layer can contain some aromatic groups to provide substrate etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. The chemically amplified resist in a bilayer system typically contains silicon and is thus able to withstand oxygen plasma etching by converting the silicon to silicon dioxide, that then withstands the etch process. After the bottom layer is etched, the resist system can be used for subsequent processing such as non-oxygen plasma etch chemistry that removes the underlying substrate.

Even though the undercoat attenuates standing waves and substrate poisoning, it poses other problems. First, some undercoat layers are soluble to the chemical amplified resist solvent component. If there is intermixing between the top and undercoat layers, the resolution and sensitivity of the top resist layer will be detrimentally affected.

In addition, if there is a large difference in the index of refraction between the chemical amplified resist and the undercoat layer, light will reflect off the undercoat layer causing standing wave effects in the resist. Thus, the real portion "n" of the index of refraction of the two layers must be made to essentially match or to have their differences minimized, and the imaginary portion "k" of the index of refraction of the two layers must be optimized to minimize reflectivity effects.

Another problem with undercoating layers is that they are sometimes too absorbent because of incorporation of aromatic groups. Some semiconductor manufacturing deep UV exposure tools utilize the same wavelength of light to both expose the resist and to align the exposure mask to the layer below the resist. If the undercoat layer is too absorbent, the reflected light needed for alignment is too attenuated to be useful. However, if the undercoat layer is not absorbent enough, standing waves may occur. A formulator must balance these competing objectives.

In addition, some undercoats have very poor plasma etch resistance to plasma chemistry. The etch resistance of the undercoat should be comparable to the etch rate of novolak resins in order to be commercially viable.

Furthermore, some undercoat layers require UV exposure in order to form cross-links before the radiation sensitive resist topcoat layer can be applied. The problem with UV cross-linking undercoat layers is that they require long exposure times to form sufficient cross-links. The long exposure times severely constrain throughput and add to the cost of producing integrated circuits. The UV tools also do not provide uniform exposure so that some areas of the undercoat layer may be cross-linked more than other areas of the undercoat layer. In addition, UV cross-linking exposure tools are very expensive and are not included in most resist coating tools because of expense and space limitations.

Some undercoat layers are cross-linked by heating. However, the problem with some of these undercoat layers is that they require high curing temperatures and long curing times before the top layer can be applied. In order to be commercially useful, undercoat layers should be curable at temperatures below 250° C. and for a time less than 180 seconds. After curing, the undercoat should have a high glass transition temperature to withstand subsequent high temperature processing and not intermix with the resist layer.

Even at temperatures below 250° C. sublimation of small amounts of the undercoated formulation (e.g. TAGs, oligomers from the polymer, etc.) or products (e.g. acids, alcohols, water) from the thermal curing frequently occur. This can result in contamination of the equipment, which requires more frequent cleaning or replacement of equipment to avoid loss of product yield and other measures. This results in increased costs and is undesirable.

In certain applications, it is desirable for the undercoat to planarize the surface of the substrate. However, this may be difficult to accomplish with undercoats undergoing thermal crosslinking. As the temperature rises and the number of crosslinks increase, the glass transition temperature of the film increases. This makes it more difficult for the film to flow and planarize the substrate. Thus it is desirable to use as low a molecular weight material as possible to improve the planarization. However, use of lower molecular weight polymers in the undercoat can adversely impact the lithographic performance of the photoresist imaging process.

In addition to the requirements for no intermixing, no sublimation, good substrate plasma etch resistance, good planarization properties, and optical properties appropriately complementing the photoresist coated over the undercoat, the undercoat must be compatible with at least one edge bead remover acceptable to the semiconductor industry as well as give excellent compatibility with the photoresist coated over the undercoat so that lithographic performance (e.g. photospeed, wall profiles, depth of focus, adhesion, etc.) are not adversely impacted. Solutions for these issues individually frequently adversely impact the performance in other areas. The present invention is directed to thermally curable polymer compositions with decreased sublimation tendencies in which lower molecular weight polymers may be employed without major adverse impacts in other performance areas.

SUMMARY OF THE INVENTION

The present invention is directed to a novel thermally curable undercoat composition comprising
a) a polymer of Structure I comprising repeating units of Structure II, III, and IV

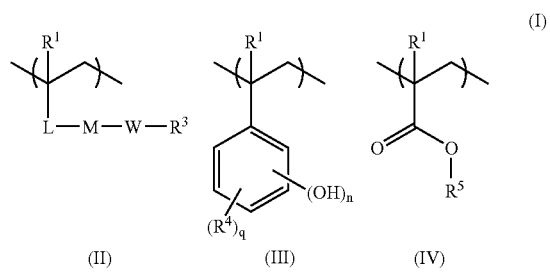

wherein each $R^1$ is independently a hydrogen atom or an alkyl group having from 1 to 3 carbon atoms or a halogen atom; L represents a single bond, a —COO— group, or a —CON($R^2$)— group; $R^2$ represents a hydrogen atom or an alkyl group having from 1 to 3 carbon atoms; M represents a $C_{5-7}$ cycloalkylene group or an arylene group having from 6 to 18 carbon atoms; W represents a single bond, a —COO— group, —O—, —(C=O)—, or —(SO$_2$)—; $R^3$ represents a hydrogen atom or a linear unsubstituted or substituted alkyl having from 5 to 30 carbon atoms or an unsubstituted or substituted cycloalkyl group having from 5 to 30 carbon atoms, a bridged unsubstituted or substituted alicyclic hydrocarbon group having from 5 to 25 carbon atoms or an unsubstituted or substituted aryl group having from 6 to 18 carbon atoms or an arylalkyl group having from 7 to 18 carbon atoms; n is an integer from 1 to 3, q is an integer from 0 to 3, the sum of n and q being no greater than 5; $R^4$ is a linear or branched or cyclic $C_1$-$C_{10}$ alkyl or a halogen group; $R^5$ is an alkyl or branched alkyl or cyclic alkyl or an unsubstituted or substituted alicyclic group, having 5 to 30 carbon atoms or $(R^6O)_tR^7$ group where $R^6$ is a $C_{1-10}$ linear or branched alkylene group and $R^7$ is linear, branched or cyclic alkyl or an unsubstituted or substituted alicyclic group or an unsubstituted or substituted aromatic or alkyl aromatic group having 1 to 30 carbon atoms and t is an integer about 1 to 4;
b) a phenolic crosslinker having Structure V

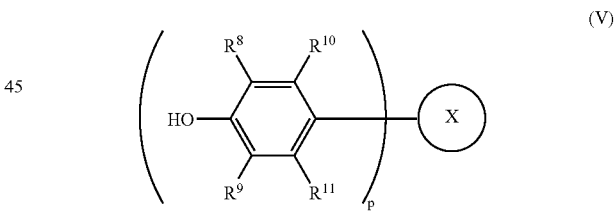

wherein p is an integer about 2 to 6; $R^8$ is a —CH$_2$OR$^{12}$ group; $R^9$ is a hydrogen atom, —CH$_2$OR$^{12}$ group, $C_1$-$C_5$ alkyl group, or aryl; $R^{10}$, $R^{11}$ and $R^{12}$ are each independently a hydrogen atom, or a $C_1$-$C_5$ alkyl group; X is a di- tri-, tetra-, penta- or hexa-valent alkyl or arylalkyl moiety;
c) a thermal acid generator (TAG) of Structure VI

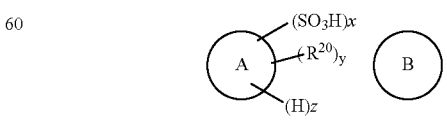

wherein A is a phenyl or naphthyl group, $R^{20}$ is an alkyl or a cyclic alkyl or an unsubstituted or substituted alicyclic group having 5 to 30 carbon atoms; when A is phenyl, x is an integer of from 1 to 3, y is an integer of from 0 to 5, the sum of x and y being no greater than 6, and z is 6−x−y; when A is naphthyl, x is an integer from 1 to 3, y is an integer from 0 to 7, the sum of x and y being no greater than 8, and z is 8−x−y; B is a primary, secondary, or tertiary unsubstituted or substituted alkyl or carbocyclic or heterocyclic amine having 4 to 30 carbon atoms; and d) a solvent.

In addition, the present invention also relates to novel polymers for the undercoat compositions, and a photolithographic coated substrate comprising: a substrate, a thermally cured undercoat composition on the substrate, and a photoresist coated over the thermally cured undercoat composition. Furthermore, the present invention further relates to a process for using the photolithographic coated substrate for the production of relief structures.

DETAILED DESCRIPTION AND EMBODIMENTS

The invention provides a thermally curable polymer composition to be used as an undercoat in lithographic processes that has low sublimation tendencies and good planarization capabilities that is compatible with high performance lithographic imaging with high formulation latitude.

The present invention is directed to a novel thermally curable undercoat composition comprising:

a) a polymer of Structure I comprising repeating units of Structure II, III, and IV

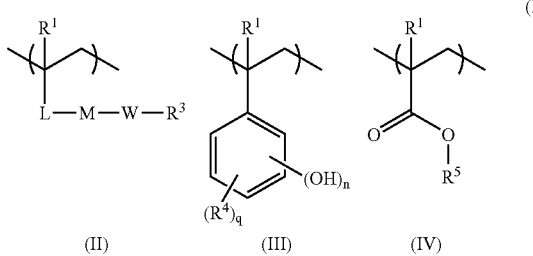

wherein each $R^1$ is independently a hydrogen atom or an alkyl group having from 1 to 3 carbon atoms or a halogen atom; L represents a single bond, a —COO— group, or a —CON($R^2$)— group; $R^2$ represents a hydrogen atom or an alkyl group having from 1 to 3 carbon atoms; M represents a $C_{5-7}$ cycloalkylene group or an arylene group having from 6 to 18 carbon atoms; W represents a single bond, a —COO— group, —O—, —(C=O)—, or —(SO$_2$)—; $R^3$ represents a hydrogen atom or a linear unsubstituted or substituted alkyl having from 5 to 30 carbon atoms or an unsubstituted or substituted cycloalkyl group having from 5 to 30 carbon atoms, a bridged unsubstituted or substituted alicyclic hydrocarbon group having from 5 to 25 carbon atoms or an unsubstituted or substituted aryl group having from 6 to 18 carbon atoms or an arylalkyl group having from 7 to 18 carbon atoms; n is an integer from 1 to 3, q is an integer from 0 to 3, the sum of n and q being no greater than 5; $R^4$ is a linear or branched or cyclic $C_1$-$C_{10}$ alkyl or a halogen group; $R^5$ is an alkyl or branched alkyl or cyclic alkyl or an unsubstituted or substituted alicyclic group, having 5 to 30 carbon atoms or $(R^6O)_tR^7$ group where $R^6$ is a $C_{1-10}$ linear or branched alkylene group and $R^7$ is linear, branched or cyclic alkyl or an unsubstituted or substituted alicyclic group or an unsubstituted or substituted aromatic or alkyl aromatic group having 1 to 30 carbon atoms and t is an integer about 1 to 4;

b) a phenolic crosslinker having Structure V

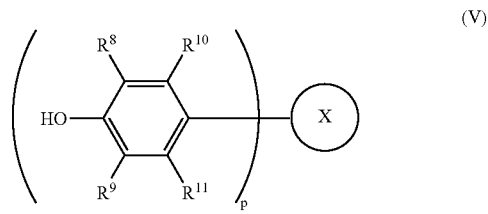

wherein p is an integer about 2 to 6; $R^8$ is a —CH$_2$OR$^{12}$ group; $R^9$ is a hydrogen atom, —CH$_2$OR$^{12}$ group, $C_1$-$C_5$ alkyl group, or aryl; $R^{10}$, $R^{11}$ and $R^{12}$ are each independently a hydrogen atom, or a $C_1$-$C_5$ alkyl group; X is a di- tri-, tetra-, penta- or hexa-valent alkyl or arylalkyl moiety;

c) a thermal acid generator (TAG) of Structure VI

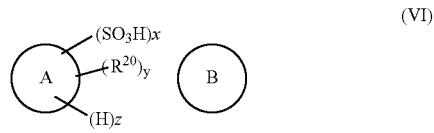

wherein A is a phenyl or naphthyl group, $R^{20}$ is an alkyl or a cyclic alkyl or an unsubstituted or substituted alicyclic group having 5 to 30 carbon atoms; when A is phenyl, x is an integer of from 1 to 3, y is an integer of from 0 to 5, the sum of x and y being no greater than 6, and z is 6−x−y; when A is naphthyl, x is an integer from 1 to 3, y is an integer from 0 to 7, the sum of x and y being no greater than 8, and z is 8−x−y; B is a primary, secondary, or tertiary unsubstituted or substituted alkyl or carbocyclic or heterocyclic amine having 4 to 30 carbon atoms; and d) a solvent.

The polymer employed in the thermally curable polymer composition comprises repeating units of Structures II, III, and IV. In the repeating unit having Structure II, $R^1$ is a hydrogen atom or an alkyl group having from 1 to 3 carbon atoms. Examples of $R^1$ groups include methyl, ethyl, propyl, and iso-propyl. Preferred $R^1$ are hydrogen and methyl. L represents a single bond, a —COO— group, or a —CON($R^2$)— group, wherein $R^2$ represents a hydrogen atom or an alkyl group having from 1 to 3 carbon atoms. Preferred L groups are a single bond, or a —COO— group. M represents a $C_5$-$C_7$ cycloalkylene group or a $C_6$-$C_{18}$ arylene group. Preferred M groups are a $C_5$-$C_7$ cycloalkylene group or a $C_6$-$C_{10}$ arylene group. W represents a single bond, a —COO— group, a —(CO)— group, or an —(SO$_2$)— group. The preferred W is a single bond.

In the repeating unit having Structure II, R3 represents a hydrogen atom, or a linear unsubstituted or substituted alkyl having from 5 to 30 carbon atoms or a cycloalkyl group having from 5 to 30 carbon atoms, a bridged alicyclic hydrocarbon group having from 5 to 25 carbon atoms or an aryl group having from 6 to 18 carbon atoms or an alkyl aryl group having from 7 to 18 carbon atoms. Suitable examples of $R^3$ include but are not limited to hydrogen, methyl, ethyl, propyl, butyl, isopropyl, isobutyl, tert-butyl, cyclohexyl, cyclopentyl, cycloheptyl cyclooctyl, cyclononyl, cyclodecanyl, cyclodecanemethyl, cyclododecyl, cyclodecanemethyl, bicyclo

[1.1.1]pentyl, bicyclo[2.1.1]hexyl, bicyclo[2.2.1]heptyl, bicyclo[3.1.1]heptyl, bicyclo[2.2.2]octyl, bicyclo[3.2.1]octyl, bicyclo[4.1.1]octyl, bicyclo[3.2.2]nonyl, bicyclo[3.3.1]nonyl, bicyclo[4.2.1]nonyl, bicyclo[5.1.1]nonyl, bicyclo[3.3.2]decyl, bicyclo[4.2.2]decyl, bicyclo[4.3.1]decyl, bicyclo[5.2.1]decyl, bicyclo[3.3.3]undecyl, bicyclo[4.3.2]undecyl, bicyclo[4.4.1]undecyl, bicyclo[5.3.1]undecyl, bicyclo[4.4.2]dodecyl, bicyclo[5.3.2]dodecyl, bicyclo[5.3.3]tridecyl, bicyclo[5.4.2]tridecyl, bicyclo[5.5.1]tridecyl, adamantyl, adamantylmethyl, tricyclo[5,2,1,0$^{2,6}$]decanemethyl, tetracyclo[4,4,0,1$^{2.5}$,1$^{7,10}$]dodecanyl, phenyl, benzyl, phenylethyl, naphthyl, naphthylmethyl and the like. Preferred R$^3$ are a hydrogen atom, cyclopentyl, cyclohexyl, bicyclo[2.2.1]heptyl, adamantyl, adamantylmethyl, tricyclo[5,2,1,0$^{2,6}$]decyl, tricyclo[5,2,1,0$^{2,6}$]decanemethyl, tetracyclo[4,4,0,1$^{2.5}$,1$^{7,1}$]dododecanyl, phenyl, benzyl, phenylethyl, naphthyl and naphthylmethyl group.

Suitable examples of monomers generating the repeating unit of Structure (II) include, but are not limited to styrene, 4-methylstyrene, 4-methoxystyrene, 4-cyclohexystyrene, 3-cyclohexystyrene, 1-vinylnaphthalene, 2-vinylnapthanlene, 4-phenylstyrene, 3-phenylstyrene, 4-(4'-phenoxyphenyl)styrene, 4-(4'-methoxyphenyl)styrene, 4-(4'-acetylphenyl)styrene, 4-(4'-benzoylphenyl)styrene, N-methylphenylacrylamide, N-methylphenylmethacrylamide, N,N-dimethylacrylamide, 4-cyclohexylphenylacrylate, 4-cyclohexylphenylmethacrylate, 4-cyclopentylphenylacrylate, 4-cyclopentylphenylmethacrylate, 4-cycloheptylphenylacrylate, 4-cycloheptylphenylmethacrylate, 3-cyclohexylphenylacrylate, 3-cyclohexylphenylmethacrylate, 3-cyclopentylphenylacrylate, 3-cyclopentylphenylmethacrylate, 3-cycloheptylphenylacrylate, 3-cycloheptylphenylmethacrylate, 2-cyclohexylphenylacrylate, 2-cyclohexylphenylmethacrylate, 2-cyclopentylphenylacrylate, 2-cyclopentylphenylmethacrylate, 2-cycloheptylphenylacrylate, 2-cycloheptylphenylmethacrylate, 4-biphenylacrylate, 4-biphenylmethacrylate, (3-phenyl)phenylacrylate, (3-phenyl)phenylmethacrylate, (2-phenyl)phenylacrylate, (2-phenyl)phenylmethacrylate, (4-benzoyl)phenylacrylate, (4-benzoyl)phenylmethacrylate, 4-(4'-methylcyclohexyl)phenylacrylate, 4-(4'-methylcyclohexyl)phenylmethacrylate, 4-(3'-methylcyclohexyl)phenylacrylate, 4-(3'-methylcyclohexyl)phenylmethacrylate, 4-(4'-tert-butylcyclohexyl)phenylacrylate, 4-(4'-tert-butylcyclohexyl)phenylmethacrylate, 4-(4'-chlorocyclohexyl)phenylacrylate, 4-(4'-chlorocyclohexyl)phenylmethacrylate, 4-(4'-bromocyclohexyl)phenylacrylate, 4-(4'-bromocyclohexyl)phenylmethacrylate, 4-(4'-methylcarbonylcyclohexyl)phenylacrylate, 4-(4'-methylcarbonylcyclohexyl)phenylmethacrylate, 4-(4'-methoxycarbonylcyclohexyl)phenylacrylate, 4-(4'-methoxycarbonylcyclohexyl)phenylmethacrylate, 4-(4'-methylphenyl)phenylacrylate, 4-(4'-methylphenyl)phenylmethacrylate, 4-(3'-methylphenyl)phenylacrylate, 4-(3'-methylphenyl)phenylmethacrylate, 4-(4'-tert-butylphenyl)phenylacrylate, 4-(4'-tert-butylphenyl)phenylmethacrylate, 4-(4'-chlorophenyl)phenylacrylate, 4-(4'-chlorophenyl)phenylmethacrylate, 4-(4'-bromophenyl)phenylacrylate, 4-(4'-bromophenyl)phenylmethacrylate, 4-(4'-methylcarbonylphenyl)phenylacrylate, 4-(4'-methylcarbonylphenyl)phenylmethacrylate, 4-(4'-methoxycarbonylphenyl)phenylacrylate, 4-(4'-methoxycarbonylphenyl)phenylmethacrylate, (4-phenylsulfonyl)phenylacrylate, (4-phenylsulfonyl)phenylmethacrylate, (4-methylsulfonyl)phenylmethacrylate, (4-benzylsulfonyl)phenylacrylate, (4-benzylsulfonyl)phenylmethacrylate, and the like. More preferred examples of monomers generating Structure (II) include styrene, 4-methylstyrene, 4-methoxystyrene, 4-cyclohexystyrene, 4-phenylstyrene, 3-phenylstyrene, 4-(4'-methoxyphenyl)styrene, 4-(4'-acetylphenyl)styrene, 4-cyclohexylphenylacrylate, 4-cyclohexylphenylmethacrylate, 4-cycloheptylphenylacrylate, 4-cycloheptylphenylmethacrylate, 4-biphenylacrylate, 4-biphenylmethacrylate, (4-benzoyl)phenylacrylate, (4-benzoyl)phenylmethacrylate, (4-acetyl)phenylacrylate, 4-(4'-methylcyclohexyl)phenylacrylate, 4-(4'-methylcyclohexyl)phenylmethacrylate, 4-(4'-chlorocyclohexyl)phenylacrylate, 4-(4'-chlorocyclohexyl)phenylmethacrylate, 4-(4'-bromocyclohexyl)phenylacrylate, 4-(4'-bromocyclohexyl)phenylmethacrylate, 4-(4'-methylcarbonylcyclohexyl)phenylacrylate, 4-(4'-methylcarbonylcyclohexyl)phenylmethacrylate, 4-(4'-methoxycarbonylcyclohexyl)phenylacrylate, 4-(4'-methoxycarbonylcyclohexyl)phenylmethacrylate, 4-(4'-methylphenyl)phenylacrylate, 4-(4'-methylphenyl)phenylmethacrylate, 4-(4'-chlorophenyl)phenylacrylate, 4-(4'-chlorophenyl)phenylmethacrylate, (4-phenylsulfonyl)phenylacrylate, (4-phenylsulfonyl)phenylmethacrylate, (4-benzylsulfonyl)phenylmethacrylate, and the like. Most preferred examples of monomers generating Structure (II) include styrene, 4-methylstyrene, 4-methoxystyrene, 4-cyclohexystyrene, 4-phenylstyrene, 1-vinylnaphthalene, 2-vinylnapthanlene, 4-cyclohexylphenylacrylate, 4-cyclohexylphenylmethacrylate, 4-biphenylacrylate, 4-biphenylmethacrylate and the like.

The polymer of Structure I further includes a repeating unit represented by Structure (III), wherein R$^1$ has the meaning as defined above; n is an integer from 1 to 2, q is an integer from 0 to 3, the sum of n and q being no greater than 5; wherein R$^4$ is a linear or branched or cyclic C$_1$-C$_{10}$ alkyl or a halogen group. Suitable examples of R$^4$ groups include but are not limited to methyl, ethyl, propyl, isopropyl, n-butyl, sec-butyl, tert-butyl, pentyl, hexyl, cyclohexyl, cyclopentyl, octyl, cyclooctyl, cyclononyl, chloro, fluoro, bromo and the like. Preferred R$^4$ groups are a halogen group or a C$_1$-C$_4$ linear or branched alkyl group. It is also preferred that q=0. Suitable examples of monomers generating Structure (III) include but are not limited to 4-hydroxystyrene, 3-hydroxystyrene, 2-hydroxystyrene, 2-methyl-4-hydroxystyrene, 2-tert-butyl-4-hydroxystyrene, 3-methyl-4-hydroxystyrene, 2-fluoro-4-hydroxystyrene, 2-chloro-4-hydroxystyrene, 3,4-dihydroxystyrene, 3,5-dihydoxystyrene, 3,4,5-trihydroxystyrene, 3,5-dimethyl-4-hydroxystyrene, 3,5-tert-butyl-4-hydroxystyrene and the like. Preferred examples of monomers generating Structure (III) include 4-hydroxystyrene, 3-hydroxystyrene, and 3,5-dihydoxystyrene. The most preferred monomer generating Structure III is 4-hydroxystyrene.

In practice, the monomeric unit described by Structure III is provided by using a derivative at the hydroxylic group which is removable. For example, hydroxystyrene (II; R1=H, n=1; q=0) can be provided by 4-acetoxystyrene or 4-trimethylsiloxystyrene. Subsequent to the polymerization, the protecting group is removed.

The polymer of Structure I further includes a repeating unit represented by Structure (IV), wherein R$^1$ has the meaning as defined above and R$^5$ is a cyclic alkyl or an unsubstituted or substituted alicyclic group having 5 to 30 carbon atoms or (R$^6$O)$_t$R$^7$ group where R$^6$ is a C$_{1-10}$ linear or branched alkylene group and R$^7$ is a linear, branched or cyclic alkyl or an unsubstituted or substituted alicyclic group or an unsubstituted or substituted aromatic or alkyl aromatic group having 1 to 30 carbon atoms and t is an integer from 1 to about 4.

Suitable examples of R$^5$ include but are not limited to cyclohexyl, cyclopentyl, cycloheptyl cyclooctyl, cyclononyl, cyclodecanyl, cyclodecanemethyl, cyclododecyl, cyclodecanemethyl, bicyclo[1.1.1]pentyl, bicyclo[2.1.1]hexyl, bicyclo[2.2.1]heptyl, bicyclo[3.1.1]heptyl, bicyclo[2.2.2]octyl, bicyclo[3.2.1]octyl, bicyclo[4.1.1]octyl, bicyclo[3.2.2]nonyl, bicyclo[3.3.1]nonyl, bicyclo[4.2.1]nonyl, bicyclo[5.1.1]nonyl, bicyclo[3.3.2]decyl, bicyclo[4.2.2]decyl, bicyclo[4.3.1]decyl, bicyclo[5.2.1]decyl, bicyclo[3.3.3]undecyl, bicyclo[4.3.2]undecyl, bicyclo[4.4.1]undecyl, bicyclo[5.3.1]undecyl, bicyclo[4.4.2]dodecyl, bicyclo[5.3.2]dodecyl, bicyclo[5.3.3]tridecyl, bicyclo[5.4.2]tridecyl, bicyclo[5.5.1]tridecyl, adamantyl, adamantylmethyl, tricyclo[5,2,1,0$^{2,6}$]decanemethyl, tetracyclo[4,4,0,1$^{2.5}$,1$^{7,10}$]dodecanyl and the like. Preferred examples of $R^5$ include cyclohexyl, bicyclo[2.1.1]hexyl, bicyclo[2.2.1]heptyl, bicyclo[3.1.1]heptyl, adamantyl, adamantylmethyl, tricyclo[5,2,1,0$^{2,6}$]decanemethyl, tetracyclo[4,4,0,1$^{2.5}$, 1$^{7,10}$]dodecanyl, ethoxycyclohexyl, propyloxycyclohexyl, isopropyloxycyclohexyl, tricyclo[5,2,1,0$^{2,6}$]decyl, ethoxytricyclo[5,2,1,0$^{2,6}$ ]decyl , and ethoxydicyclopentenyl.

Suitable examples of $R^6$ include but are not limited to methylene, ethylene, propylene, butylene, isopropylene, isobutylene and the like. Preferred examples of $R^6$ include ethylene, propylene, and isopropylene.

Suitable examples of $R^7$ include but are not limited to cyclohexyl, cyclopentyl, cycloheptyl cyclooctyl, cyclononyl, cyclodecanyl, cyclodecanemethyl, cyclododecyl, cyclodecanemethyl, bicyclo[1.1.1 ]pentyl, bicyclo[2.1.1]hexyl, bicyclo[2.2.1]heptyl, bicyclo[3.1.1]heptyl, bicyclo[2.2.2]octyl, bicyclo[3.2.1]octyl, bicyclo[4.1.1]octyl, bicyclo[3.2.2]nonyl, bicyclo[3.3.1]nonyl, bicyclo[4.2.1]nonyl, bicyclo[5.1.1]nonyl, bicyclo[3.3.2]decyl, bicyclo[4.2.2]decyl, bicyclo[4.3.1]decyl, bicyclo[5.2.1]decyl, bicyclo[3.3.3]undecyl, bicyclo[4.3.2]undecyl, bicyclo[4.4.1]undecyl, bicyclo[5.3.1]undecyl, bicyclo[4.4.2]dodecyl, bicyclo[5.3.2]dodecyl, bicyclo[5.3.3]tridecyl, bicyclo[5.4.2]tridecyl, bicyclo[5.5.1]tridecyl, adamantyl, adamantylmethyl, dicyclopentenyl, tricyclo[5,2,1,0$^{2,6}$]decyl, tricyclo[5,2,1,0$^{2,6}$]decanemethyl, tetracyclo[4,4,0,1$^{2.5}$,1$^{7,10}$]dodecanyl and the like. Preferred examples of $R^7$ include cyclohexyl, bicyclo[2.1.1]hexyl, bicyclo[2.2.1]heptyl, bicyclo[3.1.1]heptyl, bicyclo[2.2.2]octyl, bicyclo[3.2.2]nonyl, bicyclo[3.3.2]decyl, bicyclo[4.2.2]decyl, bicyclo[3.3.3]undecyl, bicyclo[4.3.2]undecyl, bicyclo[4.4.1]undecyl, bicyclo[5.3.1]undecyl, bicyclo[4.4.2]dodecyl, bicyclo[5.3.2]dodecyl, bicyclo[5.3.3]tridecyl, bicyclo[5.4.2]tridecyl, bicyclo[5.5.1]tridecyl, adamantyl, adamantylmethyl, tricyclo[5,2,1,0$^{2,6}$]decanemethyl, tricyclo[5,2,1,0$^{2,6}$]decyl, and tetracyclo[4,4,0,1$^{2.5}$,1$^{7,10}$]dodecanyl.

Suitable examples of monomers generating repeating units of Structure (IV) include but are not limited to cyclohexylacrylate, cyclohexylmethacrylate, cyclopentylacrylate, cyclopentylmethacrylate, cycloheptylacrylate, cycloheptylmethacrylate, bicyclo[2.1.1]hexylacrylate, bicyclo[2.1.1]hexylmethacrylate, bicyclo[2.2.1]heptylacrylate, bicyclo[2.2.1]heptylmethacrylate, bicyclo[3.2.1]octylacrylate, bicyclo[3.2.1]octylmethacrylate, isobornylacrylate, isobornylmethacrylate, adamantylacrylate, adamantylmethacrylate, tricyclo[5,2,1,0$^{2,6}$]decylacrylate, tricyclo[5,2,1,0$^{2,6}$]decylmethylacrylate, tricyclo[5,2,1,0$^{2,6}$]decanemethylmethacrylate, tetracyclo[4,4,0,1$^{2.5}$,1$^{7,10}$]dodecanylacrylate, tetracyclo[4,4,0,1$^{2.5}$,1$^{7,10}$]dodecanylmethacrylate, ethylene glycol methyl ether acrylate, ethylene glycol methyl ether methacrylate, ethylene glycol ethyl ether acrylate, ethylene glycol ethyl ether methacrylate, ethylene glycol dicyclopentenyl ether acrylate, ethylene glycol dicyclopentenyl ether methacrylate, ethylene glycol phenyl ether acrylate, ethylene glycol phenyl ether methacrylate, ethylene glycol benzyl ether acrylate and ethylene glycol benzyl ether methacrylate the like. Preferred example of monomers generating repeating units of Structure (IV) include cyclohexylacrylate, cyclohexylmethacrylate, bicyclo[2.1.1]hexylmethacrylate, isobornylacrylate, isobornylmethacrylate, adamantylacrylate, adamantylmethacrylate, tricyclo[5,2,1,0$^{2,6}$]decylacrylate, tricyclo[5,2,1,0$^{2,6}$]decylmethylacrylate, ethylene glycol ethyl ether methacrylate, ethylene glycol dicyclopentenyl ether acrylate, ethylene glycol dicyclopentenyl ether methacrylate, ethylene glycol phenyl ether acrylate, ethylene glycol phenyl ether methacrylate, ethylene glycol benzyl ether acrylate and ethylene glycol benzyl ether methacrylate.

The polymers of this invention can be prepared from the corresponding monomers by any suitable conventional polymerization process which reacts an ethylenically unsaturated group. Such processes include, but are not limited to, free radical or controlled radical polymerizations. Such processes typically are run in a solvent or solvent mixture using a catalyst or initiator. Initiators should be chosen based on the temperature to be employed in the polymerization, which in turn may be set by the boiling point of the solvent. The temperature employed may depend on the monomer stability, and the catalytic ability of the catalyst at the operating temperature or by the decomposition half-life of the initiator.

Suitable initiation concentrations are between about 0.001 to about 10.0% moles of initiator to total moles of monomer. The preferred range of initiator concentration is between about 0.01 to about 8.0% moles of initiator to total moles of monomer. The most preferred range of initiator concentration is between about 0.5 to about 8.0% moles of initiator to total moles of monomer.

Examples of suitable free radical initiators include, but are not limited to, benzoyl peroxide, 2,2'-azobisisobutyronitrile, 2,2'-azobis(methylisobutyronitrile), dimethyl 2,2'-azobisisobutyrate and lauroyl peroxide. Optionally, a chain transfer agent (e.g. carbon tetrabromide or 1-dodecanethiol) may be included.

Suitable solvents for polymerization include, but are not limited to, dioxane, tetrahydrofuran, 2-methyltetrahydrofuran, acetonitrile, toluene, ethylacetate, propylene glycol monomethyl ether acetate, tetrahydropyran, methyl ethyl ketone, methyl isobutyl ketone, and diglyme or any combination thereof. Polymers may be isolated by precipitation of the polymerization solution into an appropriate amount of solvent in which the polymer is insoluble. The precipitated polymer may be isolated by filtration and dried using conventional techniques known by someone skilled in the art.

The polymers of Structure I employed in the present invention have a weight average molecular weight (Mw) in terms of polystyrene of from about 5000 to about 45,000. A weight average molecular weight (Mw) in terms of polystyrene of from about 7,000 to about 30,000 is preferred. A weight average molecular weight (Mw) in terms of polystyrene of from about 8,000 to about 20,000 is more preferred. The value of Mw can be determined by such standard methods as gel permeation chromatography as described, for example, in Jan Rabek, Experimental Methods in Polymer Chemistry, John Wiley & Sons, New York, 1983. The polydispersity of the polymer may range from 1 to about 6. A preferred polydispersity of the polymer is from about 1 to about 4.

Repeating units of Structure I, III, and IV impart absorption, solubility and crosslinking and film forming functions when applied as a TCU material. Each repeating unit is focused on at least one of the three functions listed above, but may have some impact on more than other functions. This impact is dependent on the specific monomer being employed. Changing the amount of monomer represented by II in the formula can vary plasma etch resistance and absorbance, which will strongly vary the optical parameter k, whose influence is on the reflection control of TCU material. The crosslinking density and rate is determined by the amount of monomer represented by Structure III in the above formula, which also affects the optical parameter k. The solvent solubility, plasma etch resistance, and film forming properties can be optimized by choosing appropriate co-monomers of Structure III and IV. Generally, for 248 and 193 nm microlithography the optimum range of values for refractive index (n) and complex index (k) are about 1.50 to 1.80 and 0.12 to 0.28 respectively.

The absorbance properties of the polymers at a given wavelength can be altered by adjusting the particular monomers or by the concentration of the individual monomers. It should be noted that the absorbance of a given polymer may be different at different wavelengths requiring optimization of the choice of monomers to obtain not only the required optical properties for the wavelength of interest, but the other required properties as well.

The concentration of repeating units in the polymer used in 248 application having Structure II may range from about 20% to about 85 molar %. A preferred concentration of repeating units in the polymer having Structure II is from about 30% to about 80 molar %. A more preferred concentration of repeating units in the polymer having Structure II is from about 40 to about 70 molar %. A most preferred concentration of repeating units in the polymer having Structure II is from about 50% to about 70 molar %. The concentration of repeating units in the polymer having Structure III may range from about 10% to about 40 molar %. A preferred concentration of repeating units in the polymer having Structure III is from about 10% to about 35 molar %. A more preferred concentration of repeating units in the polymer having Structure III is from about 15 to about 30 molar %. A most preferred concentration of repeating units in the polymer having Structure III is from about 15% to about 25 molar %. The concentration of repeating units in the polymer having Structure IV may range from about 5% to about 40 molar %. A preferred concentration of repeating units in the polymer having Structure IV is from about 10% to about 35 molar %. A more preferred concentration of repeating units in the polymer having Structure IV is from about 15 to about 30 molar %. A most preferred concentration of repeating units in the polymer having Structure IV is from about 15% to about 25 molar %.

Preferred polymers for 248 nm application are described by Structures VII

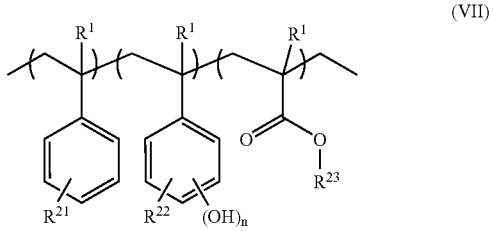

(VII)

wherein $R^1$ is a hydrogen atom or an alkyl group having from 1 to 3 carbon atoms or a halogen atom; $R^{21}$ is an unsubstituted or substituted aromatic group having $C_6$-$C_{30}$ carbon atoms; $R^{22}$ is a hydrogen or a $C_1$-$C_4$ alkyl group, $R^{23}$ is cyclic alkyl or an unsubstituted or substituted alicyclic group having 5 to 30 carbon atoms or $(R^{30}O)_tR^7$ group where $R^{30}$ is a $C_{2-4}$ linear or branched alkylene group and $R^7$ is linear, branched or cyclic alkyl or an unsubstituted or substituted alicyclic group or an unsubstituted or substituted aromatic or alkyl aromatic group having 1 to 30 carbon atoms; n is an integer of about 1 to 2 and t is an integer about 1 to 4.

Polymers described by Structures VIII are also preferred for 248 nm application

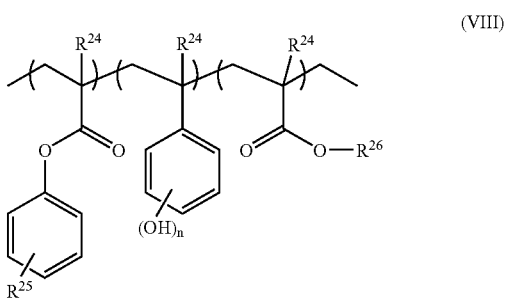

(VIII)

wherein $R^{24}$ is a hydrogen atom or a methyl group; $R^{25}$ is an unsubstituted or substituted aromatic group having $C_6$-$C_{30}$ carbon atoms; $R^{26}$ is a cyclic alkyl or an unsubstituted or substituted alicyclic group having 5 to 30 carbon atoms or $(R^{30}O)_tR^7$ group where $R^{30}$ is a $C_{2-4}$ linear or branched alkylene group and $R^7$ is a linear, branched or cyclic alkyl or an unsubstituted or substituted alicyclic group or an unsubstituted or substituted aromatic or alkyl aromatic group having 1 to 30 carbon atoms and t is an integer about 1 to 4, and n is an integer of about 1 to 2.

The concentration of repeating units in the polymer used in 193 application having Structure II may range from about 5% to about 40 molar %. A preferred concentration of repeating units in the polymer having Structure II is from about 10% to about 35 molar %. A more preferred concentration of repeating units in the polymer having Structure II is from about 15 to about 30 molar %. A most preferred concentration of repeating units in the polymer having Structure II is from about 15% to about 25 molar %. The concentration of repeating units in the polymer having Structure III may range from about 10% to about 40 molar %. A preferred concentration of repeating units in the polymer having Structure III is from about 10% to about 35 molar %. A more preferred concentration of repeating units in the polymer having Structure III is from about 15 to about 30 molar %. A most preferred concentration of repeating units in the polymer having Structure III is from about 15% to about 25 molar %. The concentration of repeating units in the polymer having Structure IV may range from about 20% to about 85 molar %. A preferred concentration of repeating units in the polymer having Structure IV is from about 30% to about 80 molar %. A more preferred concentration of repeating units in the polymer having Structure IV is from about 40 to about 70 molar %. A most preferred concentration of repeating units in the polymer having Structure IV is from about 50% to about 70 molar %.

Preferred polymers for 193 nm applications are described by Structure IX

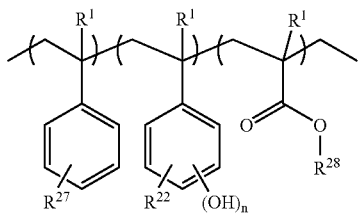

wherein $R^1$ is a hydrogen atom, an alkyl group having from 1 to 3 carbon atoms, and a halogen atom; $R^{22}$ is a hydrogen atom, and a C1-C4 alkyl group; $R^{27}$ is a hydrogen or a substituted or unsubstituted $C_5$-$C_7$ cycloalkyl; $R^{28}$ is a cyclic alkyl or an unsubstituted or substituted alicyclic group having 5 to 30 carbon atoms or $(R^{30}O)_tR^7$ group where $R^{30}$ is a $C_{2-4}$ linear or branched alkylene group and $R^7$ is a linear, branched or cyclic alkyl or an unsubstituted or substituted alicyclic group or an unsubstituted or substituted aromatic or alkyl aromatic group having 1 to 30 carbon atoms and t is an integer about 1 to 4, and n is an integer of about 1 to 3.

Novel polymers described by Structures X are also preferred for 193 nm applications

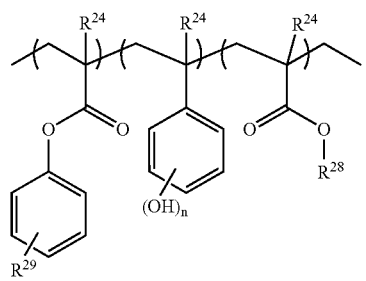

wherein $R^{24}$ is selected from the group consisting of a hydrogen atom and a methyl group; $R^{28}$ is selected from the group consisting of a cyclic alkyl, an unsubstituted or substituted alicyclic group having 5 to 30 carbon atoms and $(R^{30}O)_tR^7$ group where $R^{30}$ is a $C_{2-4}$ linear or branched alkylene group and $R^7$ is selected from the group consisting of a linear, branched or cyclic alkyl, an unsubstituted or substituted alicyclic group, and an unsubstituted or substituted aromatic or alkyl aromatic group having 1 to 30 carbon atoms and t is an integer of about 1 to 4; $R^{29}$ is a substituted or unsubstituted $C_5$-$C_7$ cycloalkyl group; and n is an integer of about 1 to 2.

The thermally curable underlayer compositions comprise a phenolic crosslinker having Structure V

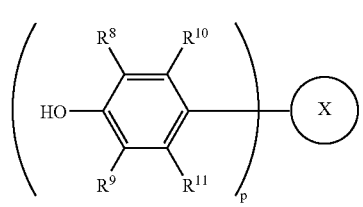

wherein p is an integer about 2 to 6; $R^8$ is a —$CH_2OR^{12}$ group; $R^9$ is a hydrogen atom, —$CH_2OR^{12}$ group, $C_1$-$C_5$ alkyl group, or aryl; $R^{10}$, $R^{11}$ and $R^{12}$ are each independently a hydrogen atom, or a $C_1$-$C_5$ alkyl group; X is a di- tri-, tetra-, penta- or hexa-valent alkyl or arylalkyl moiety. Examples of the di- tri-, tetra-, penta- or hexa-valent alkyl or arylalkyl moiety include, but are not limited to,

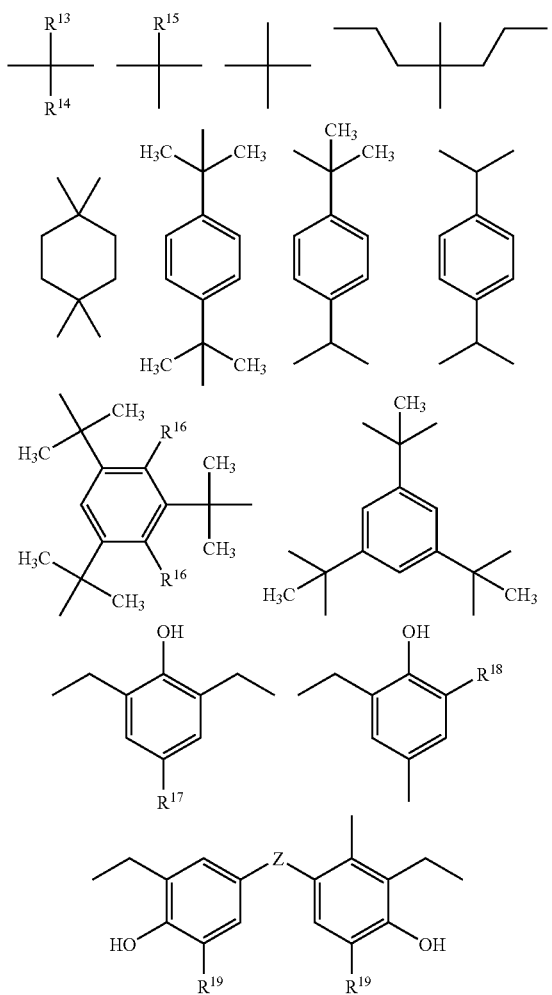

wherein $R^{13}$, $R^{14}$, $R^{15}$, $R^{16}$, are independently a hydrogen atom or a $C_1$-$C_5$ alkyl group; $R^{17}$, $R^{18}$ and $R^{19}$ are each independently a $C_1$-$C_5$ alkyl, a $C_5$-$C_8$ cycloalkyl or a cycloalkylphenyl group and Z is a bond, —O—, —S—, a $C_5$-$C_8$ cycloalkyl or a cycloalkylphenyl group.

Examples of the phenolic crosslinker having Structure V include but are not limited to,

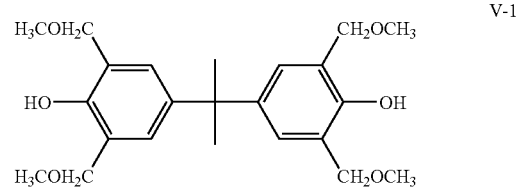

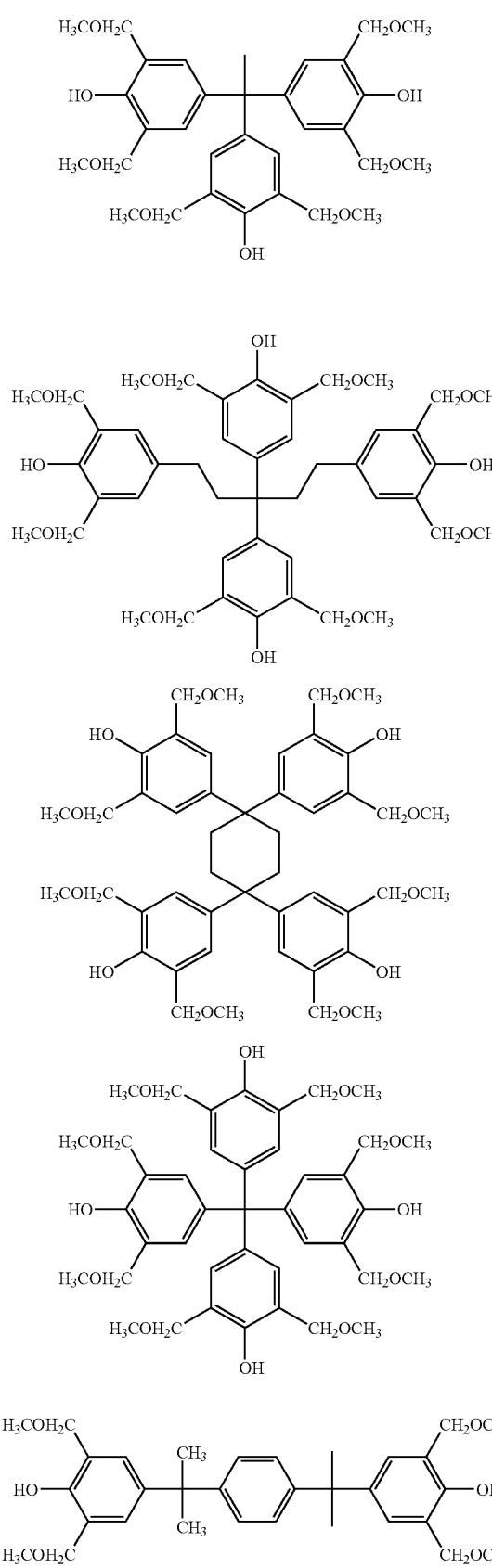
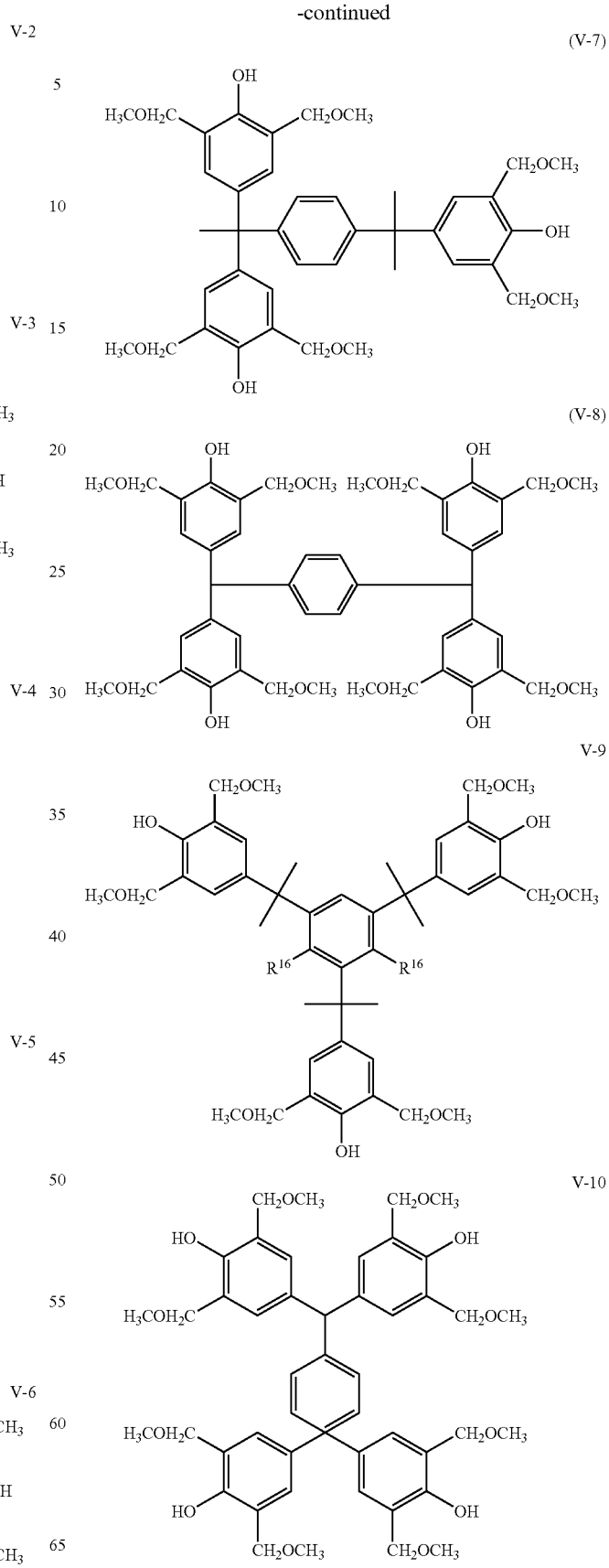

-continued

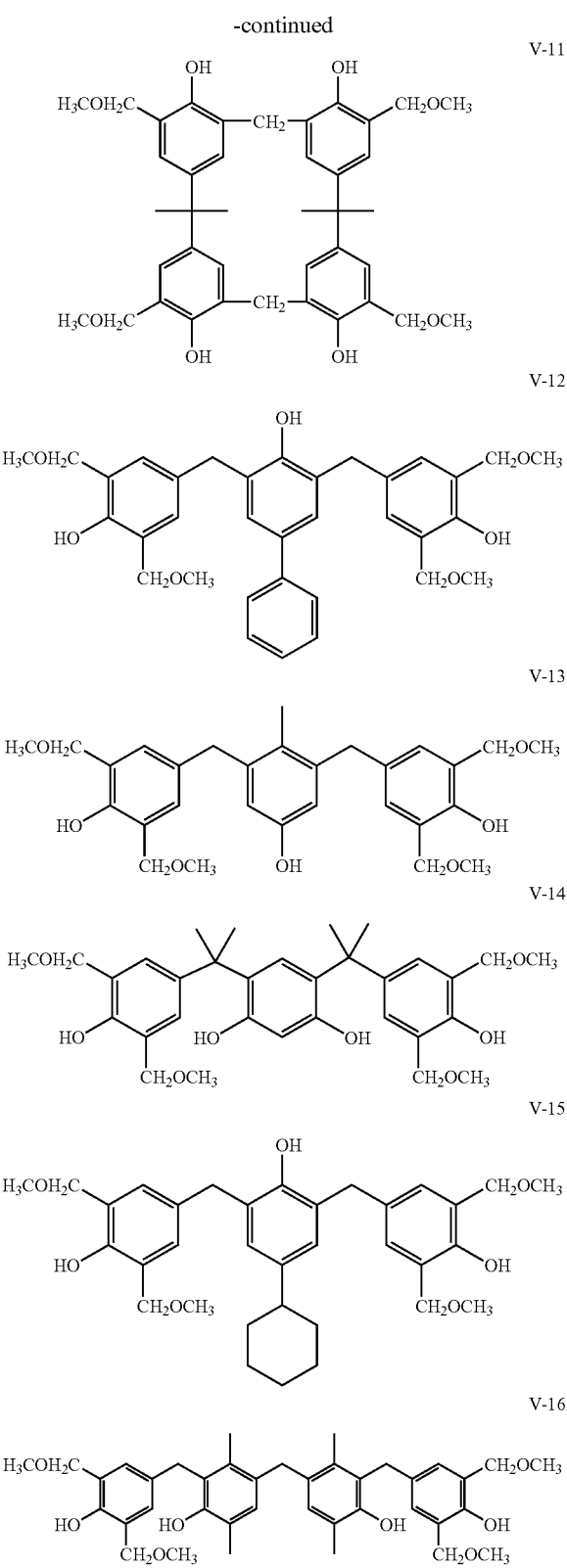

Crosslinkers employed in this invention can be purchased commercially, or prepared by hydroxymethylation or alkoxymethylation of the corresponding phenols using standard techniques known to those skilled in the art.

The thermally curable underlayer compositions comprises a thermal acid generator (TAG) of Structure VI

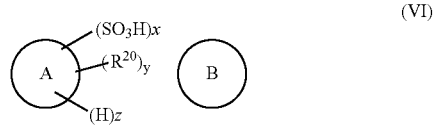

(VI)

wherein A is a phenyl or naphthyl group, $R^{20}$ is an alkyl or a cyclic alkyl or an unsubstituted or substituted alicyclic group having 5 to 30 carbon atoms; when A is phenyl, x is an integer of from 1 to 3, y is an integer of from 0 to 5, the sum of x and y being no greater than 6, and z is 6–x–y; when A is naphthyl, x is an integer from 1 to 3, y is an integer from 0 to 7, the sum of x and y being no greater than 8, and z is 8–x–y; B is a primary, secondary, or tertiary unsubstituted or substituted alkyl or carbocyclic or heterocyclic amine having 4 to 30 carbon atoms.

A variety of aromatic sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Suitable examples of $R^{20}$ include but are not limited to pentyl, cyclopentyl, hexyl, cyclohexyl, cyclooctyl, nonyl, cyclononyl, decanyl, cyclodecanyl, cyclodecanemethyl, cyclododecyl, cyclodecanemethyl, bicyclo[1.1.1]pentyl, bicyclo[2.1.1]hexyl, bicyclo[2.2.1]heptyl, bicyclo[3.1.1]heptyl, bicyclo[2.2.2]octyl, bicyclo[3.2.1]octyl and the like. Suitable examples of primary, secondary, tertiary, unsubstituted or substituted alkyl or carbocyclic group containing amines include but are not limited dibutylamine, tributylamine, dioctylamine, didecylamine, triisobutylamine, dicyclohexylamine, N-ethyldicyclohexylamine, 1-methylpyrrolidine, 1-butylpyrrolidine, piperdine, 1-methylpiperidine, hexamethyleneimine, heptamethyleneimine, tropane, quinuclidine and the like. Suitable examples heterocyclic amines include but are not limited to 4-methyl-1-oxa-3-aza-cyclopentane, 4,4-dimethyl-1-oxa-3-aza-cyclopentane, 4,4-diethyl-1-oxa-3-aza-cyclopentane, 4,4-diisopropyl-1-oxa-3-aza-cyclopentane, 4,4-ditert-butyl-1-oxa-3-aza-cyclopentane, 4,4-dimethyl-1-oxa-3-aza-cyclohexane, 1-aza-3,7-dioxa-5-ethylbicyclo[3.3.0]octane, 1-aza-3,7-dioxa-5-methylbicyclo[3.3.0]octane, 1-aza-3,7-dioxa-5-tert-butylbicyclo[3.3.0]octane and the like. Most preferred TAG is CDX-2168E, which is a dodecylbenzene sulfonic acid amine salt supplied at 25-30% activity in propylene gycol methyl ether from King Industries, Norwalk, Conn. 06852, USA.

TAGs employed in this invention can be purchased commercially, or prepared by reaction of the corresponding amine with the desired sulfonic acid.

The thermal acid generators described above should not be considered photoacid generators. Any sensitivity that the thermal acid generators would have to UV light should be very poor, and they cannot practically be used in photolithography as a photoacid generator.

Suitable solvents for the undercoat include ketones, ethers and esters, such as 2-heptanone, cyclohexanone, propylene glycol monoethyl ether acetate, propylene glycol methyl ether acetate, methyl lactate, ethyl lactate, methyl 3-methoxypropionate, N-methyl-2-pyrrolidone, ethylene glycol monoisopropyl ether, diethylene glycol monoethyl ether, diethylene glycol dimethyl ether and the like.

This invention relates to an EBR (edge bead remover) compatible thermally curable polymer composition, which may be used for forming an undercoat layer in deep UV lithography. The thermally curable polymer composition comprises the polymer of Structure I, the crosslinker of Structure V, the TAG of Structure VI and a solvent. When the composition is cast as a film and is heated, the thermal acid generator generates an acid that catalyzes the reaction of the hydroxymethyl or alkoxymethyl groups and subsequent reaction with the polymer crosslink it. After crosslinking, the undercoat is insoluble in the resist coating solvent.

The thermally curable polymer composition contains, on a total solids basis, about 65 to 95 wt. %, preferably about 70 to about 95 wt %, and more preferably about 72 to about 95 wt. % of the polymer of Structure I. The amount of the crosslinking agent in the thermally curable polymer composition is from about 3 to about 30 wt. %, preferably from about 3 to about 27 wt % and more preferably from about 3 to about 25 wt. %. The amount of the thermal acid generator in the thermally curable polymer composition is from about 0.1 to about 5 wt. %, preferably from about 0.2 to about 4 wt %, and more preferably from about 0.2 to about 3 wt. %.

The undercoat compositions are solubilized in the organic solvents described above to prepare the undercoat formulations. A specific concentration is not mandatory, although the concentration employed must be in the proper range to obtain the desired coating thickness with the specific coating tool being employed. In general the total solids content employed is from about 4.0 to about 35.0 wt %, preferably from about 5.0 to about 30.0 wt %, and more preferably from about 5.0 to about 25.0 wt. %.

The thermally curable polymer composition of the present invention should not begin significant cross-linking until it reaches a temperature of about 50° C. Significant cross-linking below 50° C. may lead to gel formation at room temperature, which will reduce its shelf life. Gel formation results in non-uniform coatings and line width variations across the substrate when the thermally curable polymer composition is used as an undercoat layer in microlithography.

The present invention also relates to a photolithographic bilayer coated substrate comprising: a substrate, a film of the thermally cured undercoat composition as described above coated on the substrate, and a radiation-sensitive resist coated over the thermally cured undercoat composition.

The substrate may be, for example, semiconductor materials such as a silicon wafer or a ceramic substrate, glass, metal, plastic or other organic film.

In a first coating step, the undercoat composition may be applied uniformly to a suitable substrate by known coating methods. Coating methods include, but are not limited to spray coating, spin coating, offset printing, roller coating, screen printing, extrusion coating, meniscus coating, curtain coating, dip coating, and immersion coating.

After the first coating step, the tacky film of undercoat composition is baked in a first bake step. The baking may take place at one temperature or multiple temperatures in one or more steps. Baking may take place on a hot plate or in various types of ovens known to those skilled in the art. Suitable ovens include ovens with thermal heating, vacuum ovens with thermal heating, and infrared ovens or infrared track modules. Typical times employed for baking will depend on the chosen baking means and the desired time and temperature and will be known to those skilled in the art. A preferred method of baking is on a hot plate. When baking on a hot plate employing a two step process, typical times range from about 0.5 minute to about 5 minutes at temperatures typically between about 80-130° C., followed by a cure step for about 0.5 minutes to about 5 minutes typically between about 170° C. to about 250° C. In a one step process, the undercoat film is cured for about 0.5 minutes to about 5 minutes typically between about 170° C. to about 250° C. The undercoat coated substrate is then allowed to cool. Preferably, the thermally curable polymer composition is cured at temperatures between about 150 to about 250° C. and more preferably between temperatures of 180 to 220° C. The preferable cure times are from about 30 to 180 seconds and more preferably from about 60 to about 120 seconds. Typical film thickness may range from about 200 nm to about 1 micron.

In a second coating step, the undercoat coated substrate is then coated with a photoresist and in a second baking step, baked. Coating and baking equipment described above for the undercoat may be employed. Typical times employed for baking will depend on the chosen baking means, the particular photoresist, the desired time and the desired temperature and will be known to those skilled in the art. A preferred method of baking is on a hot plate. When baking on a hot plate, typical times range from about 0.5 minute to about 5 minutes at temperatures typically between about 80° C. to about 140° C. Optimum bake parameters may vary depending on the Deep UV photoresist and solvent employed. Typical film thickness may range from about 100 nm to about ½ micron.

The photoresist may be any suitable radiation-sensitive resist. It is typically a chemically amplified resist sensitive to radiation in the deep UV region such as those discussed in U.S. Pat. Nos. 5,492,793 and 5,747,622. Preferably, for a bilayer resist system, the radiation-sensitive resist will contain silicon to protect it from oxygen plasma etching. Examples of suitable chemically amplified resists contain an alkali solubilizing group blocked by an acid sensitive group. Examples of suitable alkali solubilizing groups include, but are not limited to, carboxylic acids, phenols, hydroxyimides, hydroxymethylimides, fluorinated alcohols and silanols. Examples of suitable blocking groups include, but are not limited to, alkyl groups containing tertiary carbons, and alpha alkoxy alkyls, and arylisopropyl groups. Examples of suitable blocked alkali solubilizing groups include, but are not limited to, t-butyl esters, alpha alkoxy esters, alpha alkoxyalkyl aromatic ethers, t-butoxyphenyl, t-butoxyimido, and t-butoxymethylimido. Examples of blocked alkali solubilizing groups can be found in U.S. Pat. Nos. 5,468,589, 4,491, 628, 5,679,495, 6,379,861, 6,329,125, and 5,206,317, which are incorporated herein by reference.

Suitable polymers for the imaging layer are those which contain both silicon and blocked alkali solubilizing groups. Suitable polymers are those with silicon content of about 5 to about 30% silicon by weight. Preferred polymers are those with silicon content from about 8 to about 25% silicon. Examples of suitable photoresist polymers can be found in U.S. Pat. Nos. 6,146,793, 6,165,682, 6,340,734, 6,028,154, 6,042,989, 5,882,844, 5,691,396, 5,731,126, and 5,985,524. Other suitable polymers are disclosed in U.S. Pat. Nos. 6,531, 260, 6,590,010, U.S. patent application Ser. No. 09/576,146 and JP2001114835, which are incorporated herein by reference. The silicon content may be contained in the polymer before coating as in the above references or the polymer may be silylated after coating as in U.S. Pat. Nos. 6,306,990 and 6,110,637, which are incorporated herein by reference.

The radiation-sensitive resist will also contain a photoacid generating (PAG) compound. The PAG compounds may be of any suitable type such as sulfonium or iodonium salts, nitrobenzyl esters, imidosulfonates esters and the like. Typically, the PAG will be present in an amount of about 1 to 10% based on the weight of the polymer.

Any suitable photoacid generator compounds may be used in the photoresist composition. The photoacid generator compounds are well known and include, for example, onium salts such as diazonium, sulfonium, sulfoxonium and iodonium salts, nitrobenzylsulfonate esters, oximesulfonates, imidosulfonates and disulfones. Suitable photoacid generator compounds are disclosed, for example, in U.S. Pat. Nos. 5,558,978 and 5,468,589 which are incorporated herein by reference. U.S. Pat. No. 6.261.738 disclose examples of suitable oximesulfonate PAGs. Other suitable photoacid generators are perfluoroalkyl sulfonyl methides and perfluoroalkyl sulfonyl imides as disclosed in U.S. Pat. No. 5,554,664.

Suitable examples of photoacid generators are phenacyl p-methylbenzenesulfonate, benzoin p-toluenesulfonate, α-(p-toluene-sulfonyloxy)methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Examples of suitable onium salts included but are not limited to, triphenyl sulfonium bromide, triphenyl sulfonium chloride, triphenyl sulfonium iodide, triphenyl sulfonium methane sulfonate, triphenyl sulfonium trifluoromethanesulfonate, triphenyl sulfonium hexafluoropropanesulfonate, triphenyl sulfonium nonafluorobutanesulfonate, triphenyl sulfonium perfluorooctanesulfonate, triphenyl sulfonium phenyl sulfonate, triphenyl sulfonium 4-methyl phenyl sulfonate, triphenyl sulfonium 4-methoxyphenyl sulfonate, triphenyl sulfonium 4-chlorophenyl sulfonate, triphenyl sulfonium camphorsulfonate, 4-methylphenyl-diphenyl sulfonium trifluoromethanesulfonate, bis(4-methylphenyl)-phenyl sulfonium trifluoromethanesulfonate, tris-4-methylphenyl sulfonium trifluoromethanesulfonate, 4-tert-butylphenyl-diphenyl sulfonium trifluoromethanesulfonate, 4-methoxyphenyl-diphenyl sulfonium trifluoromethanesulfonate, mesityl-diphenyl sulfonium trifluoromethanesulfonate, 4-chlorophenyl-diphenyl sulfonium trifluoromethanesulfonate, bis(4-chlorophenyl)-phenyl sulfonium trifluoromethanesulfonate, tris(4-chlrophenyl) sulfonium trifluoromethanesulfonate, 4-methylphenyl-diphenyl sulfonium hexafluoropropanesulfonate, bis(4-methylphenyl)-phenyl sulfonium hexafluoropropanesulfonate, tris-4-methylphenyl sulfonium hexafluoropropanesulfonate, 4-tert-butylphenyl-diphenyl sulfonium hexafluoropropane sulfonate, 4-methoxyphenyl-diphenyl sulfonium hexafluoropropane sulfonate, mesityl-diphenyl sulfonium hexafluoropropane sulfonate, 4-chlorophenyl-diphenyl sulfonium hexafluoropropane sulfonate, bis(4-chlorophenyl)-phenyl sulfonium hexafluoropropane sulfonate, tris(4-chlrophenyl) sulfonium hexafluoropropane sulfonate, 4-methylphenyl-diphenyl sulfonium perfluorooctanesulfonate, bis(4-methylphenyl)-phenyl sulfonium perfluorooctanesulfonate, tris-4-methylphenyl sulfonium perfluoroocatanesulfonate, 4-tert-butylphenyl-diphenyl sulfonium perfluorooctane sulfonate, 4-methoxyphenyl-diphenyl sulfonium perfluorooctane sulfonate, mesityl-diphenyl sulfonium perfluorooctane sulfonate, 4-chlorophenyl-diphenyl sulfonium perfluorooctane sulfonate, bis(4-chlorophenyl)-phenyl sulfonium perfluorooctane sulfonate, tris(4-chlrophenyl) sulfonium perfluorooctane sulfonate, diphenyl iodonium hexafluoropropane sulfonate, diphenyl iodonium 4-methylphenyl sulfonate, bis(4-tert-butylphenyl)iodonium trifluoromethane sulfonate, bis(4-tert-butylphenyl)iodonium hexafluoromethane sulfonate, and bis(4-cyclohexylphenyl)iodonium trifluoromethane sulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methyl-ethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

The photoacid generator compound is typically employed in the amounts of about 0.0001 to 20% by weight of polymer solids and more preferably about 1% to 10% by weight of polymer solids.

Suitable solvents for top radiation-sensitive compositions include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl etheracetate, propylene glycol methyl ether acetate, methyl lactate, ethyl lactate, methyl pyruvate, ethyl pyruvate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. The solvents employed in the top photoresist compositions will be chosen with a view toward compatibility with the polymer resin in the undercoat and top photoresist compositions. For example, the choice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. In addition, the base can act as a diffusion control agent to prevent the acid from migrating too far and lower resolution. The percentage of base in the composition should be significantly lower than the photoacid generator or otherwise the photosensitivity becomes too low. The preferred range of the base compounds, when present, is about 3% to 50% by weight of the photoacid generator compound. Nitrogenous bases are preferred. Suitable examples of base additives are 2-methylimidazole, tetramethyl ammonium hydroxide, tetrabutylammonium hydroxide, triisopropylamine, 4-dimethylaminopryidine, 4,4'-diaminodiphenyl ether, 2,4,5-triphenylimidazole, and 1,5-diazabicyclo[4.3.0]non-5-ene, and 1,8-diazabicyclo[5.4.0]undec-7-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812.

The photoresist composition may further comprise conventional additives such as adhesion promoters and surfactants. A person skilled in the art will be able to choose the appropriate desired additive and its concentration.

The invention further relates to a process for forming a pattern on a substrate which comprises the following process steps:
A. providing a substrate,
B. coating in a first coating step said substrate with a thermally curable undercoat composition of this invention,
C. curing said undercoat composition,
D. coating in a second coating step a photoresist over the undercoat to produce a bilayer photoresist stack,
E. exposing the bilayer photoresist stack,
F. developing the photosensitive composition portion of the bilayer photoresist stack making a portion of the underlying undercoat visible,
G. rinsing the bilayer photoresist stack, and
H. etching the visible undercoat in an oxidizing plasma to produce a bilayer relief image.

For this process, the substrates, coating, and baking steps are as described for the bilayer stack previously.

For the production of relief structures, the radiation-sensitive resist is imagewise exposed to actinic radiation. The term 'imagewise' exposure includes both exposure through a photomask containing a predetermined pattern, exposure by means of any suitable source of actinic radiation, such as for example, a computer controlled laser beam which is moved over the surface of the coated substrate, exposure by means of computer-controlled electron beams, and exposure by means of X-rays or UV rays, through a corresponding mask. The imagewise exposure generates acid in the exposed regions of the resist which catalyzes the cleavage of the acid labile groups resulting in a polymer which is aqueous soluble.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer resin with the acid generated by the exposure is achieved. The duration and temperature of this post-exposure bake can vary within broad limits and depend essentially on the functionalities of the polymer resin, the type of acid generator and on the concentration of these two components. The exposed resist is typically subjected to temperatures of about 50° C. to 150° C. for a few seconds to a few minutes. The preferred post exposure bake is from about 80° C. to 130° C. for about 5 seconds to 180 seconds. Any suitable heating means may be employed. The preferred heating means is a hot plate.

After imagewise exposure and any heat treatment of the material, the exposed areas of the photoresist are removed by dissolution in an aqueous base developer to generate a relief structure. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer.

Development can be carried out by means of immersion, spray, puddling, or other similar developing methods known to those skilled in the art at temperatures from about 10° C. to 40° C. for about 30 seconds to about 5 minutes with or without agitation. After development, the relief pattern may be optionally rinsed with a rinse comprising de-ionized water or de-ionized water containing one or more surfactants and dried by spinning, baking on a hot plate, in an oven, or other suitable means.

The radiation-sensitive resist used for the bilayer process described above will typically contain silicon or have silicon incorporated into the resist after development. After images are formed in the radiation-sensitive resist, the imaged substrate will be placed in a plasma-etching environment comprising oxygen so that the underlayer coating will be removed in the area unprotected by the resist. The silicon incorporated in the radiation-sensitive resist forms silicon dioxide when exposed to an oxygen plasma and protects the resist from being etched so that relief structures can be formed in the undercoat layer.

After the oxygen plasma step, the substrate carrying the bilayer relief structure is generally subjected to at least one further treatment step, which changes the substrate in areas not covered by the bilayer coating. Typically, this can be implantation of a dopant, deposition of another material on the substrate or an etching of the substrate. This is usually followed by the removal of the resist coating from the substrate typically by a fluorine/oxygen plasma etch.

The invention is illustrated by, but not limited to, the following examples in which the parts and percentages are by weight unless otherwise specified.

General Synthetic Procedure for Polymerization in Tetrahydrofuran (THF):

The mixture of monomers and chain transfer agent were dissolved in THF under $N_2$ in a round bottom flask equipped with a reflux condenser, a temperature probe and a gas inlet. The mixture was heated to 55° C. while stirring. Solution degassed by bubbling $N_2$ with syringe for 15 minutes. A solution of initiator in THF was added and the solution was heated to 65° C. for 20-24 hours under a $N_2$ atmosphere. The reaction mixture was then cooled to 50° C. The reaction mixture was diluted by methanol (50 mL) and sodium methoxide solution (4 g, 10 wt % in methanol) were added for methanolysis. The mixture was refluxed at 64° C. and the by-product methyl acetate was continuously removed by azeotropic distillation using Dean-Stark trap for 4 h. After cooling to room temperature, Amberlyst 15 resin (15 g) was added to the mixture to ion exchange with sodium and stirred for 1 h. The resin was filtered and the solution was precipitated into a methanol/water mixture (1.6 L, 2:1 methanol/water) by slow addition. The solid polymer was isolated by filtration and washed with water (100 mL×2). After filtration, the solid was dried at 60° C. for 48 h under vacuum. Molecular weights and molecular weight distributions were measured using a Waters Corp. liquid chromatograph (refractive index detection, Millennium (GPC V software), equipped with the following Phenogel-10, 7.8×250 mm columns:

10-4A, 500A & 50A (from Phenomena) and THF eluent. Thermal decomposition measurements (TGA) were performed using a Perkin-Elmer thermal gravimetric analyzer. The glass transition temperature (Tg) of the polymer was measured using a Perkin-Elmer Pyris 1 Differential Scanning Calorimeter at a heating rate of 20° C./minute. The structure and composition of polymer were analyzed with a $^1$H NMR using a Bruker 400 MHz NMR-spectrometer. See Table 1 for analytical data of the polymer examples.

SYNTHESIS EXAMPLE 1

The mixture of monomers [4-biphenyl methacrylate (72.37 g, 0.303 mol), acetoxy styrene (10.56 g, 0.065 mol) and ethylene glycol dicyclopentenyl ether methacrylate (17.07 g, 0.065 mol)] and initiator VAZO 67 (6.00 g, 6.0 wt % vs monomers) and chain transfer agent 1-dodecanethiol (1.80 g, 30 wt % vs initiator) were polymerized according to the general procedure above. Transesterification employed 4.0 g sodium methoxide solution. Yield: 91.3 g, 94%.

SYNTHESIS EXAMPLE 2

The mixture of monomers [4-biphenyl methacrylate (62.74 g, 0.263 mol), acetoxy styrene (14.23 g, 0.087 mol) and ethylene glycol dicyclopentenyl ether methacrylate (23.03 g, 0.087 mol)] and initiator VAZO 67 (6.00 g, 6.0 wt % vs monomers) and chain transfer agent 1-dodecanethiol (1.80 g, 30 wt % vs initiator) were polymerized according to the general procedure above. Tranesterification employed 5.0 g sodium methoxide solution. Yield: 91.5 g, 95%.

SYNTHESIS EXAMPLE 3

The mixture of monomers [4-biphenyl methacrylate (54.09 g, 0.227 mol), acetoxy styrene (22.09 g, 0.136 mol) and ethylene glycol dicyclopentenyl ether methacrylate (23.82 g, 0.09 mol)] and initiator VAZO 67 (6.00 g, 6.0 wt % vs monomers) and chain transfer agent 1-dodecanethiol (1.80 g, 30 wt % vs initiator) were polymerized according to the general procedure above. Transesterification employed 6.0 g sodium methoxide solution. Yield: 85.5 g, 91%.

SYNTHESIS EXAMPLE 4

The mixture of monomers [biphenyl methacrylate [BPMA](37.74 g; 0.158 mol), acetoxy styrene (8.54 g; 0.0527 mol) and ethyleneglycol dicyclopentenyl ether methacrylate (13.82 g; 0.0527 mol) and chain transfer agent, 1-dodecanethiol (1.08 g, 30 wt % of initiator) were dissolved in 83.6 g of PGMEA (propylene glycol methyl ether acetate) (40% of solid) under flow of $N_2$ in a 500 mL, round bottom flask equipped with a reflux condenser and a gas inlet. The mixture was heated to 70° C. Then, VAZO 67® [free radical initiator, Dupont product, 2,2'-azobis(2-methylbutyronitrile)] (3.6 g, 6 wt % of monomer used) in 6.4 g of PGMEA was added slowly for 15 minutes to the reaction mixture and stirred for 24 h under $N_2$. The disappearance of BPMA was monitored by GPC using a UV detector at 254 nm. After 24 h, residual BPMA was <0.1%. The reaction mixture was cooled to room temperature. Then, 2.0 g of sodium methoxide in methanol (10 wt %) and 50 ml methanol were added to the flask. The reaction mixture was refluxed for 3 h and about 25 ml of methanol was removed by azeotropic distillation using a Dean-Stark trap. The solution was then cooled to room temperature and 10.0 g of Amberlyst 15 resin was added to it. The reaction mixture was stirred for 2 h and the resin was isolated by filtration. The solution was distilled to half of the volume under vacuum <60° C. to remove methanol and by-product, propylene glycol methyl ether. Finally, a 30 wt % of solid solution was made by adding PGMEA to it.

SYNTHESIS EXAMPLE 5

The mixture of monomers [biphenyl methacrylate [BPMA](37.74 g; 0.158 mol), acetoxy styrene (8.54 g; 0.0527 mol) and ethyleneglycol dicyclopentenyl ether methacrylate (13.82 g; 0.0527 mol) and chain transfer agent, 1-dodecanethiol (1.08 g, 30 wt % of initiator) were dissolved in 83.6 g of PGMEA (propylene glycol methyl ether acetate) (40% of solid) under flow of $N_2$ in a 500 mL, round bottom flask equipped with a reflux condenser and a gas inlet. The mixture was heated to 70° C. Then, VAZO 67® [free radical initiator, Dupont product, 2,2'-azobis(2-methylbutyronitrile)] (3.6 g, 6 wt % of monomer used) in 6.4 g of PGMEA was added slowly for 15 minutes to the reaction mixture. Then, the temperature was slowly increased to 80° C. and stirred for 4 h under $N_2$. The disappearance of BPMA was monitored by GPC using a UV detector at 254 nm. After 3 h, residual BPMA was <0.1%. The mixture was cooled to room temperature. Then, 2.0 g of sodium methoxide in methanol (10 wt %) and 50 ml methanol were added to the flask. The reaction mixture was refluxed for 3 h and about 25 ml of methanol was removed by azeotropic distillation using a Dean-Stark trap. The solution was then cooled to room temperature and 10.0 g of Amberlyst 15 resin was added to it. The reaction mixture was stirred for 2 h and the resin was separated by filtration. The solution was distilled to half of the volume under vacuum <60° C. to remove methanol and by-product, propylene glycol methyl ether. Finally, a 30 wt % of solid solution was made by adding PGMEA to it.

SYNTHESIS EXAMPLE 6

The mixture of monomers [cyclohexyl methacrylate (32.73 g, 0.1945 mol), 4-acetoxystyrene (10.52 g, 0.0648 mol) and styrene (6.75 g, 0.0648 mol)] and chain transfer agent 1-dodecanethiol (0.9 g, 0.0044 mol) were dissolved in THF (73 g, 40% solid) in a 500 mL three neck round bottom flask. The initiator VAZO-67 (3.0 g, 0.0156 mol) dissolved in THF (2 g) was added to mixture at 55° C. and was heated to 65° C. for 24 h. The polymer was processed as described in the General Synthetic Procedure for Polymerization in Tetrahydrofuran.

SYNTHESIS EXAMPLE 7

The mixture of monomers [cyclohexyl methacrylate (32.73 g, 0.1945 mol), 4-acetoxystyrene (10.52 g, 0.0648 mol) and styrene (6.75 g, 0.0648 mol)] was dissolved in THF (73 g, 40% solid) in a 500 mL three neck round bottom flask. The initiator VAZO-67 (1.5 g, 0.0078 mol) dissolved in THF (2 g) was added to mixture at 55° C. and was heated to 65° C. for 24 h. No chain transfer agent was used. The polymer was processed as described in the General Synthetic Procedure for Polymerization in Tetrahydrofuran.

SYNTHESIS EXAMPLE 8

The mixture of monomers [cyclohexyl methacrylate (28.16 g, 0.1674 mol), 4-acetoxystyrene (9.05 g, 0.0558 mol) and 4-cyclohexylphenyl acrylate (12.79 g, 0.0558 mol)] and chain transfer agent 1-dodecanethiol (0.8 g, 0.0040 mol) were dissolved in THF (73 g, 40% solid) in a 500 mL three neck round bottom flask. The initiator VAZO-67 (2.5 g, 0.0130 mol) dissolved in THF (2 g) was added to mixture at 55° C. and was heated to 65° C. for 24 h. The polymer was processed as described in the General Synthetic Procedure for Polymerization in Tetrahydrofuran.

SYNTHESIS EXAMPLE 9

The mixture of monomers [cyclohexyl methacrylate (28.16 g, 0.1674 mol), 4-acetoxystyrene (9.05 g, 0.0558 mol) and 4-cyclohexylphenyl acrylate (12.79 g, 0.0558 mol)] was dissolved in THF (73 g, 40% solid) in a 500 mL three neck round bottom flask. The initiator VAZO-67 (3.0 g, 0.0156 mol) dissolved in THF (2 g) was added to mixture at 55° C. and was heated to 65° C. for 24 h. No chain transfer agent was used. The polymer was processed as described in the General Synthetic Procedure for Polymerization in Tetrahydrofuran.

SYNTHESIS EXAMPLE 10

The mixture of monomers [cyclohexyl methacrylate (27.69 g, 0.1646 mol), 4-acetoxystyrene (8.90 g, 0.0549 mol) and 4-cyclohexylphenyl methacrylate (13.41 g, 0.0549 mol)] and chain transfer agent 1-dodecanethiol (1.2 g, 0.0059 mol) were dissolved in THF (73 g, 40% solid) in a 500 mL three neck round bottom flask. The initiator VAZO-67 (4.0 g, 0.0208 mol) dissolved in THF (2 g) was added to mixture at 55° C. and was heated to 65° C. for 24 h. The polymer was processed as described in the General Synthetic Procedure for Polymerization in Tetrahydrofuran.

SYNTHESIS EXAMPLE 11

The mixture of monomers [cyclohexyl methacrylate (27.69 g, 0.1646 mol), 4-acetoxystyrene (8.90 g, 0.0549 mol) and 4-cyclohexylphenyl methacrylate (13.41 g, 0.0549 mol)] was dissolved in THF (73 g, 40% solid) in a 500 mL three neck round bottom flask. The initiator VAZO-67 (2.5 g, 0.0130 mol) dissolved in THF (2 g) was added to mixture at 55° C. and was heated to 65° C. for 24 h. No chain transfer agent was used. The polymer was processed as described in the General Synthetic Procedure for Polymerization in Tetrahydrofuran.

SYNTHESIS EXAMPLE 12

The mixture of monomers [cyclohexyl methacrylate (27.69 g, 0.1646 mol), 4-acetoxystyrene (8.90 g, 0.0549 mol) and 4-cyclohexylphenyl methacrylate (13.41 g, 0.0549 mol)] and chain transfer agent 1-dodecanethiol (1.5 g, 0.0074 mol) were dissolved in THF (148 g, 25% solid) in a 500 mL three neck round bottom flask. The initiator VAZO-67 (5.0 g, 0.0260 mol) dissolved in THF (2 g) was added to mixture at 55° C. and was heated to 65° C. for 24 h. The polymer was processed as described in the General Synthetic Procedure for Polymerization in Tetrahydrofuran.

SYNTHESIS EXAMPLE 13

The mixture of monomers [TCD methacrylate (22.94 g, 0.104 mol), 4-acetoxystyrene (12.51 g, 0.078 mol) and 4-cyclohexylstyrene(14.55 g, 0.078 mol)] and chain transfer agent 1-dodecanethiol (1.5 g, 0.0074 mol) were dissolved in THF (148 g, 25% solid) in a 500 mL three neck round bottom flask. The initiator VAZO-67 (2.5 g, 0.0130 mol) dissolved in THF (2 g) was added to the mixture at 55° C. and was heated to 65° C. for 24 h. The polymer was processed as described in the General Synthetic Procedure for Polymerization in Tetrahydrofuran.

SYNTHESIS EXAMPLE 14

The mixture of monomers [4-phenylstyrene (28.01 g, 0.155 mol), 4-acetoxystyrene (8.40 g, 0.058 mol) and ethyleneglycol dicyclopentenyl ether methacrylate (15.39 g; 0.058 mol) and chain transfer agent 1-dodecanethiol (1.5 g, 0.0074 mol) are dissolved in THF (148 g, 25% solid) in a 500 mL three neck round bottom flask. The initiator VAZO-67 (2.5 g, 0.0130 mol) dissolved in THF (5 g) is added to the mixture at 55° C. and is heated to 65° C. for 24 h. The polymer is processed as described in the General Synthetic Procedure for Polymerization in Tetrahydrofuran.

TABLE 1

| Syn. Ex. | Structure II/III/IV | NMR Mole Ratio | MW | PDI | Tg | Thermal Stability (5% wt loss) |
| --- | --- | --- | --- | --- | --- | --- |
| 1 | 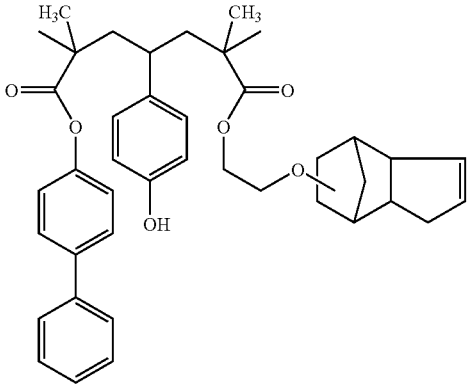 | II 0.69<br>III 0.16<br>IV 0.15 | 14666 | 1.92 | 128 | 310 |

TABLE 1-continued
| Syn. Ex. | Structure II/III/IV | NMR Mole Ratio | | MW | PDI | Tg | Thermal Stability (5% wt loss) |
|---|---|---|---|---|---|---|---|
| 2 | 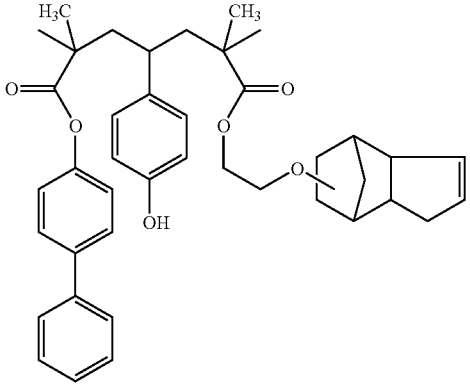 | II<br>III<br>IV | 0.60<br>0.19<br>0.21 | 13175 | 1.97 | 124 | 305 |
| 3 | 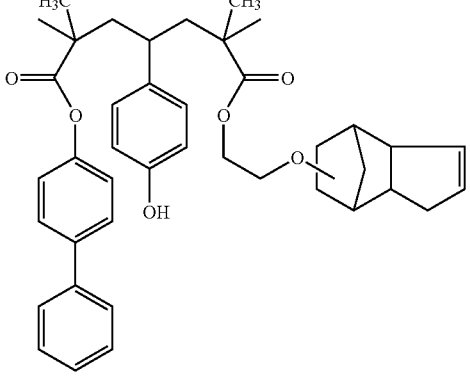 | II<br>III<br>IV | 0.51<br>0.28<br>0.21 | 11262 | 1.88 | 118 | 300 |
| 4 | 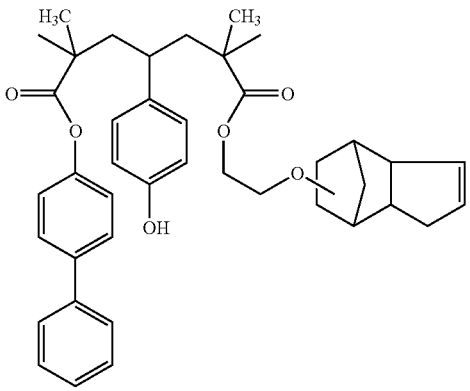 | II<br>III<br>IV | 0.59<br>0.20<br>0.21 | 15700 | 1.95 | — | — |

TABLE 1-continued

| Syn. Ex. | Structure II/III/IV | NMR Mole Ratio | MW | PDI | Tg | Thermal Stability (5% wt loss) |
|---|---|---|---|---|---|---|
| 5 | | II 0.60<br>III 0.19<br>IV 0.21 | 11044 | 2.11 | — | — |
| 6 | | II 0.15<br>III 0.19<br>IV 0.66 | 10088 | 2.21 | 90 | 256 |
| 7 | | II 0.29<br>III 0.24<br>IV 0.47 | 22812 | 2.16 | 120 | 312 |
| 8 | | II 0.22<br>III 0.20<br>IV 0.58 | 13216 | 2.71 | 98 | 311 |

TABLE 1-continued
| Syn. Ex. | Structure II/III/IV | NMR Mole Ratio | | MW | PDI | Tg | Thermal Stability (5% wt loss) |
|---|---|---|---|---|---|---|---|
| 9 | 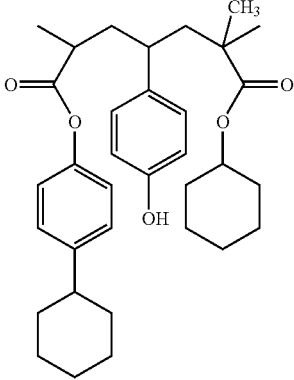 | II<br>III<br>IV | 0.20<br>0.22<br>0.58 | 40189 | 4.35 | 113 | 301 |
| 10 | 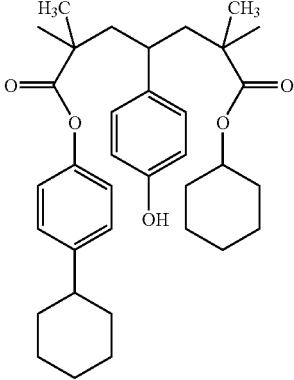 | II<br>III<br>IV | 0.25<br>0.20<br>0.55 | 8132 | 2.05 | 97 | 285 |
| 11 | 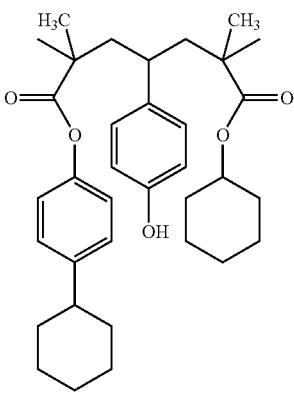 | II<br>III<br>IV | 0.24<br>0.20<br>0.56 | 28966 | 3.92 | 122 | 275 |

TABLE 1-continued
| Syn. Ex. | Structure II/III/IV | NMR Mole Ratio | MW | PDI | Tg | Thermal Stability (5% wt loss) |
|---|---|---|---|---|---|---|
| 12 | 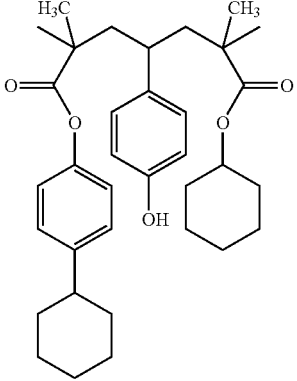 | II 0.24<br>III 0.19<br>IV 0.57 | 6031 | 2.04 | 84 | 268 |
| 13 | 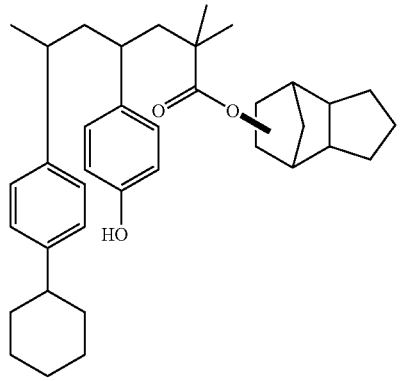 | II 0.33<br>III 0.27<br>IV 0.40 | 12300 | 3.0 | 138 | 318 |
| 14 | 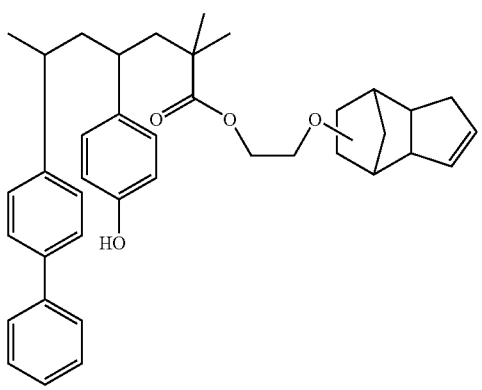 | II 0.59<br>III 0.21<br>IV 0.20 | 15400 | 2.5 | 140 | 275 |

Table 2A contains information on polymers obtained from a polymer vendor by custom synthesis.

TABLE 2A

[Chemical structure showing a polymer with methyl groups, ester linkages to biphenyl and hydroxyphenyl groups, and a dicyclopentadienyl ether substituent]

| Polymer # | Mole Ratio of Monomer by NMR | | | MW | PDI | Tg (° C.) |
|---|---|---|---|---|---|---|
| | II | III | IV | | | |
| P-1 | 0.63 | 0.18 | 0.19 | 15,174 | 2.24 | 106 |
| P-2 | 0.62 | 0.18 | 0.20 | 14,473 | 2.24 | 100 |
| P-3 | 0.64 | 0.18 | 0.18 | 18,845 | 2.35 | 113 |
| P-4 | 0.63 | 0.19 | 0.18 | 17,897 | 2.51 | 104 |
| P-5 | 0.63 | 0.19 | 0.18 | 12,800 | 2.21 | |
| P-6 | 0.65 | 0.18 | 0.17 | 12,241 | 2.36 | |
| P-7 | 0.65 | 0.18 | 0.17 | 13,473 | 2.41 | |
| P-8 | 0.61 | 0.19 | 0.20 | 13,135 | 2.35 | |
| P-9 | 0.63 | 0.19 | 0.18 | 16,708 | 2.11 | 114 |
| P-10 | 0.62 | 0.21 | 0.17 | 15,848 | 2.54 | 101 |
| P-11 | 0.57 | 0.21 | 0.22 | 13703 | 1.69 | |
| P-12 | 0.59 | 0.20 | 0.21 | 12812 | 1.79 | |

Table 2B contains information on polymers obtained from a polymer vendor by custom synthesis

TABLE 2B

[Chemical structure showing a polymer with methyl groups, ester linkages to cyclohexylphenyl and hydroxyphenyl groups, and a cyclohexyl ester substituent]

| Polymer # | Mole Ratio of Monomer by NMR | | | MW | PDI | Tg (° C.) |
|---|---|---|---|---|---|---|
| | II | III | IV | | | |
| P-13 | 0.24 | 0.19 | 0.57 | 9900 | 1.9 | — |

Table 3 lists information about TAGs used in examples in this application.

TABLE 3

| TAG example | TAG Name | TAG Type | Solvent system | % active |
|---|---|---|---|---|
| A | CHTS | Cyclohexyl tosylate | — | 100 |
| B | Nacure 5925 | Amine neutralized DDBSA | Isopropanol | 25 |
| C | Nacure 1323 | Amine neutralized DNNSA | Xylene | 21 |
| D | Nacure XC-3210 | Polymeric DDBSA covalent blocked | Xylene | 25 |
| E | Nacure 1953 | DDBSA covalent blocked | n-butanol/2-butoxyethanol | 25 |
| F | Nacure 1557 | Amine neutralized DNNSA | n-butanol/2-butoxyethanol | 25 |
| G | Nacure 1419 | Epoxyblocked DNNSA | Xylene/MIBK | 30 |
| H | CDX-2167 | Amine neutralized DDBSA | PGMEA | 27.5 |
| I | CDX-2168E | Amine neutralized DDBSA | PGME | 27.5 |

DDBSA: dodecylbenzenesulfonic acid;
DNNSA: dinonylnaphthalenesulfonic acid.

UNDERCOAT FORMULATION EXAMPLE 1 (COMPARATIVE)

For 50g of undercoat solution in a 2 oz amber bottle, 7.02 g of polymer P-1, 2.00 g (15% solution) of CYMEL 303 cross linker, 0.19 g of TAG A, and 40.80 g of propylene glycol methyl ether acetate (PGMEA) were mixed. The mixture was then rolled overnight, and the undercoat solution was filtered through a 0.20 μm filter. CYMEL 303 is an alkoxymethylmelamine crosslinker from Cytec Industries.

UNDERCOAT FORMULATION EXAMPLE 2 (COMPARATIVE)

For 50 g of undercoat solution in a 2 oz amber bottle, 6.96 g of polymer P-2, 2.00 g (15% solution) of CYMEL 303 cross linker, 0.96 g of TAG B solution, and 40.08 g of propylene glycol methyl ether acetate (PGMEA) were mixed. The mixture was then rolled overnight, and the undercoat solution was filtered through a 0.20 μm filter.

UNDERCOAT FORMULATION EXAMPLE 3 (COMPARATIVE)

For 50 g of undercoat solution in a 2 oz amber bottle, 6.94 g of polymer P-2, 2.00 g (15% solution) of CYMEL 303 cross linker, 1.26 g of TAG C solution, and 39.80 g of propylene glycol methyl ether acetate (PGMEA) were mixed. The mixture was then rolled overnight, and the undercoat solution was filtered through a 0.20 μm filter.

UNDERCOAT FORMULATION EXAMPLE 4 (COMPARATIVE)

For 50 g of undercoat solution in a 2 oz amber bottle, 6.96 g of polymer P-2, 2.00 g (15% solution) of CYMEL 303 cross linker, 0.96 g of TAG D solution, and 40.08 g of propylene glycol methyl ether acetate (PGMEA) were mixed. The mixture was then rolled overnight, and the undercoat solution was filtered through a 0.20 μm filter.

UNDERCOAT FORMULATION EXAMPLE 5 (COMPARATIVE)

For 50 g of undercoat solution in a 2 oz amber bottle, 6.96 g of polymer P-2, 2.00 g (15% solution) of CYMEL 303 cross linker, 0.96 g of TAG E solution, and 40.08 g of propylene glycol methyl ether acetate (PGMEA) were mixed. The mixture was then rolled overnight, and the undercoat solution was filtered through a 0.20 μm filter.

UNDERCOAT FORMULATION EXAMPLE 6 (COMPARATIVE)

For 50 g of undercoat solution in a 2 oz amber bottle, 6.94 g of polymer P-2, 2.00 g (15% solution) of CYMEL 303 cross linker, 1.06 g of TAG F solution, and 40.01 g of propylene glycol methyl ether acetate (PGMEA) were mixed. The mixture was then rolled overnight, and the undercoat solution was filtered through a 0.20 μm filter.

UNDERCOAT FORMULATION EXAMPLE 7 (COMPARATIVE)

For 50 g of undercoat solution in a 2 oz amber bottle, 6.94 g of polymer P-2, 2.00 g (15% solution) of CYMEL 303 cross linker, 0.88 g of TAG G solution, and 40.18 g of propylene glycol methyl ether acetate (PGMEA) were mixed. The mixture was then rolled overnight, and the undercoat solution was filtered through a 0.20 μm filter.

EXAMPLE 1

Sublimation Testing Procedure (Comparative)

A blank 150 mm virgin bare silicon wafer was weighed on an analytical scale to 5 significant figures. This wafer will be known as the collection wafer. Each example formulation was spin coated onto ten 150 mm bare silicon wafers. Film thickness after coating was 5300 Å. The coated wafer was placed over a 205° C. hotplate with a gap distance of about 8.22 cm. A Teflon ring with an inner diameter of 120 mm, an outer diameter of 130 mm, and a thickness of 2 mm was then placed on top of the coated wafer. The collection wafer then was placed onto the Teflon ring, polished side down. The two wafers were then lowered directly onto the 205° C. hotplate for 5 seconds. After five seconds both wafers were removed from the hotplate. The collection wafer was allowed to cool on a chill plate for 10 seconds. The coated wafer was then discarded. This procedure was repeated for all ten coated wafers. After the tenth wafer, and the weight of the collection wafer was obtained and the delta between the starting weight and final weight was calculated. This procedure was repeated for all the example formulations.

The results for the sublimation testing for each of the examples can be found in Table 4. All experiments are comparative.

TABLE 4

Summary of the Formulations and sublimation results of the Undercoat Formulations

| Undercoat formulation Ex. # | Polymer (% in formulation) | Cross-linking Agent | Thermal Acid Generator (TAG) | TAG (% in formulation) | Weight of collected sublimate(grams) |
|---|---|---|---|---|---|
| 1 | 14.01 | CYMEL 303 | A | 0.38 | 0.00244 |
| 2 | 13.92 | CYMEL 303 | B | 0.48 | 0.00021 |
| 3 | 13.87 | CYMEL 303 | C | 0.53 | 0.00045 |
| 4 | 13.92 | CYMEL 303 | D | 0.48 | 0.00020 |
| 5 | 13.92 | CYMEL 303 | E | 0.48 | 0.00161 |
| 6 | 13.87 | CYMEL 303 | F | 0.53 | 0.00025 |
| 7 | 13.87 | CYMEL 303 | G | 0.53 | 0.00013 |

Data in Table 4 shows that the type of TAG used greatly influences the amount of material being sublimed during curing of the undercoat

UNDERCOAT FORMULATION EXAMPLE 8 (COMPARATIVE)

For 50 g of undercoat solution in a 2 oz amber bottle, 6.98 g of polymer P-9, 2.00 g (15% solution) of CYMEL 303 cross linker, 0.90 g of TAG B solution, and 40.13 g of propylene glycol methyl ether acetate (PGMEA) were mixed. The mixture was then rolled overnight, and the undercoat solution was filtered through a 0.20 μm filter.

UNDERCOAT FORMULATION EXAMPLE 9 (COMPARATIVE)

For 50 g of undercoat solution in a 2 oz amber bottle, 6.90 g of polymer P-2, 2.50 g (15% solution) of Powderlink cross linker, 0.90 g of TAG B solution, and 39.70 g of propylene glycol methyl ether acetate (PGMEA) were mixed. The mixture was then rolled overnight, and the undercoat solution was filtered through a 0.20 μm filter. Powderlink is an alkoxymethylated glycoluril crosslinker available from Cytec Industries.

UNDERCOAT FORMULATION EXAMPLE 10

For 50 g of undercoat solution in a 2 oz amber bottle, 5.03 g of polymer P-9, 15.00 g (15% solution) of cross linker V-7, 0.90 g of TAG B solution, and 29.08 g of propylene glycol methyl ether acetate (PGMEA) were mixed. The mixture was then rolled overnight, and the undercoat solution was filtered through a 0.20 μm filter. V-7 can be obtained from Honshu Chemicals.

LITHOGRAPHIC EXAMPLES 1-4

Lithographic performance of 140 nm trench 280 nm pitch using a silicon containing resist TIS 248IL-01-23 (available from FUJIFILM Electronic Materials, Inc.) over various undercoat formulations was examined. All samples were spun coated to a film thickness of 500 nm undercoat and cured at 200° C. for 90 seconds proximity bake. TIS 248IL-01-23 was spun on top of UL coated wafers to a film thickness of 235 nm. A softbake of 125° C. for 90 seconds was applied. All wafers were exposed with a Canon EX6 stepper 0.65NA annular illumination using 248 nm light. 0.80/0.50 sigma. A post exposure bake of 115° C. for 90 seconds was applied and wafers were puddle developed with OPD262 for 60 seconds and rinsed with DI water. Profiles of 140 nm trench 280 pitch were then examined with a Hitachi cross sectional SEM for profile. Results can be found in Table 5. Lithographic Experiments 1-3 are comparative.

UNDERCOAT FORMULATION EXAMPLE 11 (COMPARATIVE)

For 50 g of undercoat solution in a 2 oz amber bottle, 7.38 g of polymer P-6, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

UNDERCOAT FORMULATION EXAMPLE 12 (COMPARATIVE)

For 50 g of undercoat solution in a 2 oz amber bottle, 7.38 g of polymer P-5, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

UNDERCOAT FORMULATION EXAMPLE 13 (COMPARATIVE)

For 50 g of undercoat solution in a 2 oz amber bottle, 7.38 g of polymer P-8, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

UNDERCOAT FORMULATION EXAMPLE 14 (COMPARATIVE)

For 50 g of undercoat solution in a 2 oz amber bottle, 7.38 g of polymer P-7, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

TABLE 5

Summary of the Formulations and Profile results of TIS 248IL-01-23 with the Undercoat Formulations

| Litho. Ex. # | Undercoat formulation Ex. # | Polymer (% in formulation) | Cross-linking Agent | Cross-linker (% in formulation) | Thermal Acid Generator (TAG) | TAG (% in formulation) | Footing - 140 nm Trench 280 nm Pitch |
|---|---|---|---|---|---|---|---|
| 1 | 1 | 14.01 | CYMEL 303 | 0.60 | A | 0.38 | 0.00244 |
| 2 | 8 | 13.95 | CYMEL 303 | 0.60 | B | 0.45 | Heavy footing |
| 3 | 9 | 13.80 | Powderlink | 0.75 | B | 0.45 | Heavy footing |
| 4 | 10 | 10.05 | V-7 | 4.50 | B | 0.45 | Heavy footing |

Table 5 shows that despite the improvement in sublimation performance, the TAG change in the undercoat formulation negatively impacts the lithographic performance of the photoresist by increasing the width of the image at the photoresist-undercoat interface (footing).

UNDERCOAT FORMULATION EXAMPLE 15 (COMPARATIVE)

For 50 g of undercoat solution in a 2 oz amber bottle, 7.38 g of polymer P-2, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

UNDERCOAT FORMULATION EXAMPLE 16 (COMPARATIVE)

For 50 g of undercoat solution in a 2 oz amber bottle, 7.38 g of polymer P-2, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 μm filter.

UNDERCOAT FORMULATION EXAMPLE 17 (COMPARATIVE)

For 50 g of undercoat solution in a 2 oz amber bottle, 7.38 g of polymer P-3, 0.77 g (15% solution) of CYMEL 303 cross linker, 0.05 g of TAG H solution, 0.50 g of a 1% solution of the surfactant Troysol, and 41.31 g of propylene glycol methyl ether acetate (PGMEA) were mixed. The mixture was then rolled overnight, and the undercoat solution was filtered through a 0.20 µm filter.

UNDERCOAT FORMULATION EXAMPLE 18

For 50 g of undercoat solution in a 2 oz amber bottle, 6.36 g of polymer P-5, 7.50 g (15% solution) of cross linker V-7, 0.05 g of TAG H solution, 0.50 g of a 1% solution of the surfactant Troysol, and 35.59 g of propylene glycol methyl ether acetate (PGMEA) were mixed. The mixture was then rolled overnight, and the undercoat solution was filtered through a 0.20 µm filter.

LITHOGRAPHIC EXAMPLES 5-14

Lithographic performance of 140 nm trench 280 nm pitch using TIS 248IL-01-23 over various undercoat formulations was examined. All samples were spun coated to a film thickness of 500 nm undercoat and cured at 200° C. for 90 seconds proximity bake. TIS 248IL-01-23 was spun on top of UL coated wafers to a film thickness of 235 nm. A softbake of 125° C. for 90 seconds was applied. All wafers were exposed with a Canon EX6 stepper 0.65NA annular illumination using 248 nm light. 0.80/0.50 sigma. A post exposure bake of 115° C. for 90 seconds was applied and wafers were puddle developed with OPD262 for 60 seconds and rinsed with DI water. Adhesion failure of 130 and 140 nm trench 1:1 pitch were then examined with a Hitachi cross sectional SEM for profile. Results can be found in Table 6. Lithographic examples 5-11 are comparative.

TABLE 6

Summary of the Formulations and Profile results of TIS 248IL-01-23 with the Undercoat Formulations

| Lith. Ex. # | Undercoat formulation | Polymer Mw | Cross linking Agent | Cross-linker (% in formulation) | TAG (% in formulation) | PGMEA (% in formulation) | Adhesion Failure 130 and/or 140 nm trench |
|---|---|---|---|---|---|---|---|
| 5 | 11 | 12,241 | CYMEL 303 | 0.23 | 0.03 | 85.00 | Yes |
| 6 | 12 | 12,800 | CYMEL 303 | 0.23 | 0.03 | 85.00 | Yes |
| 7 | 13 | 13,135 | CYMEL 303 | 0.23 | 0.03 | 85.00 | Yes |
| 8 | 14 | 13,473 | CYMEL 303 | 0.23 | 0.03 | 85.00 | Yes |
| 9 | 15 | 14,473 | CYMEL 303 | 0.23 | 0.03 | 85.00 | Yes |
| 10 | 16 | 15,848 | CYMEL 303 | 0.23 | 0.03 | 85.00 | No |
| 11 | 17 | 18,845 | CYMEL 303 | 0.23 | 0.03 | 85.00 | No |
| 12 | 18 | 12,800 | V-7 | 2.25 | 0.03 | 85.00 | No |
| 13 | 19 | 14,473 | V-7 | 2.25 | 0.03 | 85.00 | No |
| 14 | 20 | 18,845 | V-7 | 2.25 | 0.03 | 85.00 | No |

UNDERCOAT FORMULATION EXAMPLE 19

For 50 g of undercoat solution in a 2 oz amber bottle, 6.36 g of polymer P-2, 7.50 g (15% solution) of cross linker V-7, 0.05 g of TAG H solution, 0.50 g of a 1% solution of the surfactant Troysol, and 35.59 g of propylene glycol methyl ether acetate (PGMEA) were mixed. The mixture was then rolled overnight, and the undercoat solution was filtered through a 0.20 µm filter.

UNDERCOAT FORMULATION EXAMPLE 20

For 50 g of undercoat solution in a 2 oz amber bottle, 6.36 g of polymer P-3, 7.50 g (15% solution) of cross linker V-7, 0.05 g of TAG H solution, 0.50 g of a 1% solution of the surfactant Troysol, and 35.59 g of propylene glycol methyl ether acetate (PGMEA) were mixed. The mixture was then rolled overnight, and the undercoat solution was filtered through a 0.20 µm filter.

Results in Table 6 show that the undercoat formulations using the cross linker CYMEL 303 require higher polymer Mw to obtain adequate lithographic performance. Use of the V-7 crosslinker in combination with an amine sulfonate TAG provides an undercoat which has low sublimation and allows the use of low molecular weight polymers for better planarization. In addition, the wider molecular weight range in which it provides good performance gives more formulation latitude to account for batch to batch polymer variations.

UNDERCOAT FORMULATION EXAMPLE 21 (COMPARATIVE)

For 20 g of undercoat solution, to a 1 oz amber bottle were added, 8.97 g of polymer solution (P-13) (31.9% wt % in PGMEA), 2.00 g (15% solution) of CYMEL 303 cross linker, 0.055 g of TAG H solution, 0.21 g of 1% Troysol solution in PGMEA, and 9.96 g of propylene glycol methyl ether acetate (PGMEA). The mixture was then rolled overnight, and the undercoat solution was filtered through a 0.20 µm filter.

UNDERCOAT FORMULATION EXAMPLE 22 (COMPARATIVE)

For 20 g of undercoat solution, to a 1 oz amber bottle were added, 8.97 g of polymer solution (P-13) (31.9 wt % in PGMEA), 0.12 g of Powderlink cross linker, 0.055 g of TAG H solution, 0.21 g of 1% Troysol solution in PGMEA, and 9.96 g of propylene glycol methyl ether acetate (PGMEA). The mixture was then rolled overnight, and the undercoat solution was filtered through a 0.20 µm filter.

UNDERCOAT FORMULATION EXAMPLE 23

For 20 g of undercoat solution, to a 1 oz amber bottle were added, 8.61 g of polymer solution (P-13) (31.9 wt % in PGMEA), 1.6 g of V-7 cross linker (15% wt % in PGMEA), 0.054 g of TAG H solution, 0.21 g of 1% Troysol solution in PGMEA, and 9.53 g of propylene glycol methyl ether acetate (PGMEA). The mixture was then rolled overnight, and the undercoat solution was filtered through a 0.20 µm filter.

UNDERCOAT FORMULATION EXAMPLE 24

For 20 g of undercoat solution, to a 1 oz amber bottle were added, 8.42 g of polymer solution (P-13) (31.9 wt % in PGMEA), 2.0 g of V-7 cross linker (15% wt % in PGMEA), 0.054 g of TAG H solution, 0.21 g of 1% Troysol solution in PGMEA, and 9.32 g of propylene glycol methyl ether acetate (PGMEA). The mixture was then rolled overnight, and the undercoat solution was filtered through a 0.20 µm filter.

UNDERCOAT FORMULATION EXAMPLE 25

For 20 g of undercoat solution, to a 1 oz amber bottle were added, 8.23 g of polymer solution (P-13) (31.9 wt % in PGMEA), 2.4 g of V-7 cross linker (15% wt % in PGMEA), 0.054 g of TAG H solution, 0.21 g of 1% Troysol solution in PGMEA, and 9.11 g of propylene glycol methyl ether acetate (PGMEA). The mixture was then rolled overnight, and the undercoat solution was filtered through a 0.20 µm filter.

UNDERCOAT FORMULATION EXAMPLE 26

For 20 g of undercoat solution, to a 1 oz amber bottle were added, 8.61 g of polymer solution (P-13) (31.9 wt % in PGMEA), 1.6 g of V-7 cross linker (15% wt % in PGMEA), 0.044 g of TAG H solution, 0.21 g of 1% Troysol solution in PGMEA, and 9.53 g of propylene glycol methyl ether acetate (PGMEA). The mixture was then rolled overnight, and the undercoat solution was filtered through a 0.20 µm filter.

UNDERCOAT FORMULATION EXAMPLE 27

For 20 g of undercoat solution, to a 1 oz amber bottle were added, 8.43 g of polymer solution (P-13) (31.9 wt % in PGMEA), 2.0 g of V-7 cross linker (15% wt % in PGMEA), 0.044 g of TAG H solution, 0.21 g of 1% Troysol solution in PGMEA, and 9.32 g of propylene glycol methyl ether acetate (PGMEA). The mixture was then rolled overnight, and the undercoat solution was filtered through a 0.20 µm filter.

UNDERCOAT FORMULATION EXAMPLE 28

For 20 g of undercoat solution, to a 1 oz amber bottle were added, 8.24 g of polymer solution (P-13) (31.9 wt % in PGMEA), 2.4 g of V-7 cross linker (15% wt % in PGMEA), 0.044 g of TAG H solution, 0.21 g of 1% Troysol solution in PGMEA, and 9.11 g of propylene glycol methyl ether acetate (PGMEA). The mixture was then rolled overnight, and the undercoat solution was filtered through a 0.20 µm filter.

UNDERCOAT FORMULATION EXAMPLE 29

For 20 g of undercoat solution, to a 1 oz amber bottle were added, 8.41 g of polymer solution (P-13) (31.9 wt % in PGMEA), 2.0 g of V-7 cross linker (15% wt % in PGMEA), 0.066 g of TAG H solution, 0.21 g of 1% Troysol solution in PGMEA, and 9.32 g of propylene glycol methyl ether acetate (PGMEA). The mixture was then rolled overnight, and the undercoat solution was filtered through a 0.20 µm filter.

UNDERCOAT FORMULATION EXAMPLE 30

For 20 g of undercoat solution, to a 1 oz amber bottle were added, 8.22 g of polymer solution (P-13) (31.9 wt % in PGMEA), 2.4 g of V-7 cross linker (15% wt % in PGMEA), 0.066 g of TAG H solution, 0.21 g of 1% Troysol solution in PGMEA, and 9.11 g of propylene glycol methyl ether acetate (PGMEA). The mixture was then rolled overnight, and the undercoat solution was filtered through a 0.20 µm filter.

LITHOGRAPHIC EXAMPLES 15-24

Lithographic performance of 120 nm trench (240 nm pitch) using a silicon containing resist TIS 193IL-54-20 (available from FUJIFILM Electronic Materials, Inc.) over various undercoat formulations was examined. All samples were spun coated to a film thickness of 500 nm undercoat and cured at 200° C. for 60 seconds contact bake. TIS 193IL-54-20 was spun on top of UL coated wafers to a film thickness of 235 nm. A softbake of 125° C. for 60 seconds was applied. All wafers were exposed with an Ultratech Microstepper using 0.60NA annular illumination; 0.80/0.70 sigma with 193 nm light. A post exposure bake of 115° C. for 60 seconds was applied and wafers were puddle developed with OPD262 for 60 seconds and rinsed with DI water. Pattern fidelity of the 120 nm trenches at 1:1 pitch was then examined with a Hitachi cross sectional SEM for profile. The results can be found in Table 7. Lithographic Examples 15 and 16 are comparative.

TABLE 7

Summary of the Formulations and Profile results of TIS 193IL-54-20 with the Undercoat Formulations

| Litho Ex. # | Undercoat formulation | Cross-linking Agent | Cross-linker (% in formulation) | TAG H (% in formulation) | PGMEA (% in formulation) | Pattern Fidelity of 120 nm trench |
|---|---|---|---|---|---|---|
| 15 | 21 | CYMEL 303 | 0.23 | 0.075 | 85.00 | Severe footing |
| 16 | 22 | Powderlink | 0.23 | 0.075 | 85.00 | Adhesion failure |

TABLE 7-continued

Summary of the Formulations and Profile results of TIS 193IL-54-20 with the Undercoat Formulations

| Litho Ex. # | Undercoat formulation | Cross-linking Agent | Cross-linker (% in formulation) | TAG H (% in formulation) | PGMEA (% in formulation) | Pattern Fidelity of 120 nm trench |
|---|---|---|---|---|---|---|
| 17 | 23 | V-7 | 1.2 | 0.075 | 85.00 | Vertical, clean profiles |
| 18 | 24 | V-7 | 1.5 | 0.075 | 85.00 | Vertical, clean profiles |
| 19 | 25 | V-7 | 1.8 | 0.075 | 85.00 | Vertical, clean profiles |
| 20 | 26 | V-7 | 1.2 | 0.060 | 85.00 | Vertical, clean profiles |
| 21 | 27 | V-7 | 1.5 | 0.060 | 85.00 | Vertical, clean profiles |
| 22 | 28 | V-7 | 1.8 | 0.060 | 85.00 | Vertical, clean profiles |
| 23 | 29 | V-7 | 1.5 | 0.090 | 85.00 | Vertical, clean profiles |
| 24 | 30 | V-7 | 1.8 | 0.090 | 85.00 | Vertical, clean profiles |

Results in Table 7 show that the undercoat formulations using the cross linker V-7 in combination with TAG H, promote robust lithographic patterning of the imaging layer across a range of TAG and cross linker loadings in the undercoat. In contrast, use of CYMEL 303 crosslinker promotes unacceptable severe footing at the base of the patterned imaging layer profiles. The use of Powderlink crosslinker results in unacceptable adhesion failure of the imaging layer patterns.

UNDERCOAT FORMULATION EXAMPLE 31

For 50 g of undercoat solution in a 2 oz amber bottle, 17.09 g of polymer P-11 solution (35% in PGMEA), 10.0 g (15% solution in PGMEA) of cross linker V-7, 0.05 g of TAG I solution, and 22.86 g of PGMEA were mixed. The mixture was then rolled overnight, and the undercoat solution was filtered through a 0.20 µm filter.

UNDERCOAT FORMULATION EXAMPLE 32

For 50 g of undercoat solution in a 2 oz amber bottle, 17.09 g of polymer P-12 solution (35% in PGMEA), 10.0 g (15% solution in PGMEA) of cross linker V-7, 0.05 g of TAG I solution, and 22.86 g of PGMEA were mixed. The mixture was then rolled overnight, and the undercoat solution was filtered through a 0.20 µm filter.

EXAMPLE 2

Undercoat Formulation Examples 31 and 32 were tested according to the procedure described in Example 1. Table 8 contains the results.

TABLE 8

| Undercoat formulation Ex. # | Polymer (% in formulation) | Cross-linking Agent | Thermal Acid Generator (TAG) | TAG (% in formulation) | Weight of collected sublimate (grams) |
|---|---|---|---|---|---|
| 31 | 11.96 | V-7 | I | 0.03 | 0.00003 |
| 32 | 11.96 | V-7 | I | 0.03 | 0.00005 |

The data in Table 8 shows that the combination of the amine neutralized sulfonic acid TAG and the alkoxymethylated phenolic crosslinker had only trace amounts of sublimate, lower even than those in Table 4.

UNDERCOAT FORMULATION EXAMPLE 33

For 200 g of undercoat solution in a 8 oz amber bottle, 121.55 of the polymer prepared in Synthesis Example 6 (13% solution in PGMEA), 5.2 g (20% solution in PGMEA) of crosslinker V-1, 3.25 of TAG C solution and 70.0 g of PGMEA are mixed. The mixture is then rolled overnight, and the undercoat solution is filtered through a 0.20 µm filter.

LITHOGRAPHIC EXAMPLE 25

The undercoat from Undercoat Formulation Example 33 is lithographically tested using the procedure employed in Lithographic Examples 1-4. The resultant 140 nm features have good resolution with excellent adhesion.

UNDERCOAT FORMULATION EXAMPLE 34

For 50 g of undercoat solution in a 2 oz amber bottle, 30.39 of the polymer prepared in Synthesis Example 14 (13% solution in PGMEA), 1.3 g (20% solution in PGMEA) of crosslinker V-10, 0.82 of TAG F solution, and 17.5 of PGMEA. The mixture is then rolled overnight, and the undercoat solution is filtered through a 0.20 µm filter.

LITHOGRAPHIC EXAMPLE 26

The undercoat from Undercoat Formulation Example 34 is lithographically tested using the procedure employed in Lithographic Examples 15-24. The resultant 120 nm features have good resolution with excellent adhesion.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. A thermally curable undercoat composition comprising
a) a polymer of Structure I comprising repeating units of Structure II, III, and IV

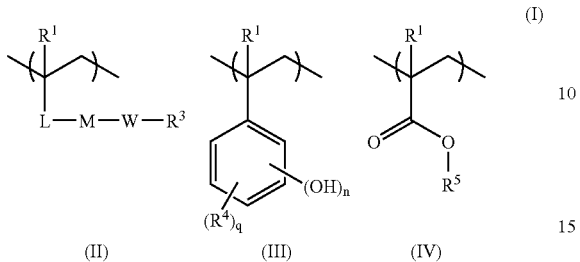

wherein each $R^1$ is independently selected from the group consisting of a hydrogen atom, an alkyl group having from 1 to 3 carbon atoms, and a halogen atom; L is selected from the group consisting of
  (1) a single bond and a —CON($R^2$)— group wherein $R^2$ is selected from the group consisting of a hydrogen atom and an alkyl group having from 1 to 3 carbon atoms when M is a $C_{5-7}$ cycloalkylene group, W is selected from the group consisting of a single bond, a —COO— group, —O—, —(C=O)—, and —(SO$_2$)—, and $R^3$ is selected from the group consisting of a hydrogen atom, a linear unsubstituted or substituted alkyl having from 5 to 30 carbon atoms, an unsubstituted or substituted cycloalkyl group having from 5 to 30 carbon atoms, a bridged unsubstituted or substituted alicyclic hydrocarbon group having from 5 to 25 carbon atoms, an unsubstituted or substituted aryl group having from 6 to 18 carbon atoms and an arylalkyl group having from 7 to 18 carbon atoms; n is an integer from 1 to 3, q is an integer from 0 to 3, the sum of n and q being no greater than 5;
  (2) a —CON($R^2$)— group wherein $R^2$ is selected from the group consisting of a hydrogen atom and an alkyl group having from 1 to 3 carbon atoms, when M is an arylene group having from 6 to 18 carbon atoms, W is selected from the group consisting of a —COO— group, —O—, —(C=O)—, and —(SO$^2$)—, and $R^3$ is selected from the group consisting of a hydrogen atom, a linear unsubstituted or substituted alkyl having from 5 to 30 carbon atoms, an unsubstituted or substituted cycloalkyl group having from 5 to 30 carbon atoms, a bridged unsbstituted or substituted alicyclic hydrocarbon group having from 5 to 25 carbon atoms, an unsubstituted or substituted aryl group having from 6 to 18 carbon atoms and an arylalkyl group having from 7 to 18 carbon atoms; n is an integer from 1 to 3, q is an integer from 0 to 3, the sum of n and q being no greater than 5;
  (3) a —COO— group when M is cycloalkylene, W is selected from the group consisting of —COO—, —O—, —C=O— and —(SO$_2$)— and $R^3$ is selected from the group consisting of a hydrogen atom, a linear unsubstituted or substituted alkyl having from 5 to 30 carbon atoms, an unsubstituted or substituted cycloalkyl group having from 5 to 30 carbon atoms, a bridged unsubstituted or substituted alicyclic hydrocarbon group having from 5 to 25 carbon atoms, an unsubstituted or substituted aryl group having from 6 to 18 carbon atoms and an arylalkyl group having from 7 to 18 carbon atoms; n is an integer from 1 to 3, q is an integer from 0 to 3, the sum of n and q being no greater than 5; and
  (4) a —COO— group when M is cycloalkylene, W is a single bond and $R^3$ is selected from the group consisting of a linear unsubstituted or substituted alkyl having from 5 to 30 carbon atoms, an unsubstituted or substituted cycloalkyl group having from 5 to 30 carbon atoms, a bridged unsubstituted or substituted alicyclic hydrocarbon group having from 5 to 25 carbon atoms, an unsubstituted or substituted aryl group having from 6 to 18 carbon atoms and an arylalkyl group having from 7 to 18 carbon atoms; n is an integer from 1 to 3, q is an integer from 0 to 3, the sum of n and q being no greater then 5;

$R^4$ is selected from the group consisting of a linear or branched or cyclic $C_1$-$C_{10}$ alkyl and a halogen group; $R^5$ is selected from the group consisting of a linear, branched or cyclic alkyl and an unsubstituted or substituted alicyclic group, having 5 to 30 carbon atoms, and a ($R^6$O)$_t R^7$ group where $R^6$ is a $C_{1-10}$ linear or branched alkylene group and $R^7$ is selected from the group consisting of a linear, branched or cyclic alkyl, an unsubstituted or substituted alicyclic group and an unsubstituted or substituted aromatic or alkyl aromatic group having 1 to 30 carbon atoms and t is an integer from 1 to 4;

b) a phenolic crosslinker having Structure V

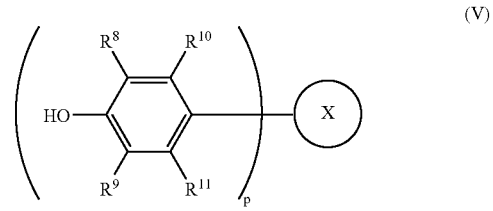

wherein p is an integer of about 2 to 6; $R^8$ is a —CH$_2$OR$^{12}$ group; $R^9$ is selected from the group consisting of a hydrogen atom, —CH$_2$OR$^{12}$ group, $C_1$-$C_5$ alkyl group, and aryl; $R^{10}$, $R^{11}$ and $R^{12}$ are each independently selected from the group consisting of a hydrogen atom, and a $C_1$-$C_5$ alkyl group; X is a di- tri-, tetra-, penta- or hexa-valent alkyl or arylalkyl moiety;

c) a thermal acid generator (TAG) of Structure VI

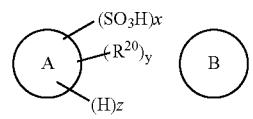

wherein A is selected from the group consisting of a phenyl and a naphthyl group, $R^{20}$ is selected from the group consisting of an alkyl or a cyclic alkyl and an unsubstituted or substituted alicyclic group having 5 to 30 carbon atoms; when A is phenyl, x is an integer of from 1 to 3, y is an integer of from 0 to 5, the sum of x and y being no greater than 6, and z is 6-x-y; when A is naphthyl, x is an integer from 1 to 3, y is an integer from 0 to 7, the sum of x and y being no greater than 8, and z is 8-x-y; B is a primary, secondary, or tertiary unsubstituted or substituted alkyl or carbocyclic or heterocyclic amine having 4 to 30 carbon atoms; and d) a solvent.

2. A thermally curable undercoat composition comprising a) a polymer of Structure I comprising repeating units selected from the group consisting of Structures VII, VIII, and X

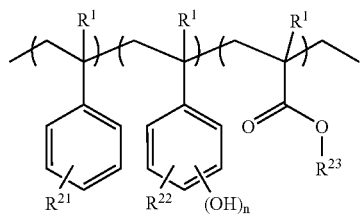

(VII)

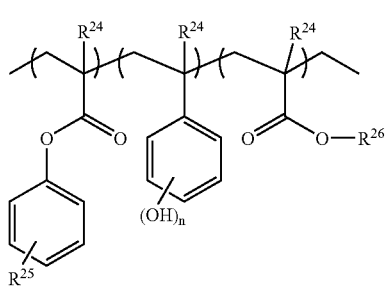

(VIII)

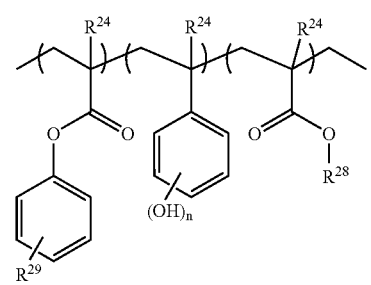

(X)

wherein $R^1$ is selected from the group consisting of a hydrogen atom, an alkyl group having from 1 to 3 carbon atoms and a halogen atom; $R^{24}$ is selected from the group consisting of a hydrogen atom and a methyl group; $R^{21}$ is an unsubstituted or substituted aromatic group having $C_6$-$C_{30}$ carbon atoms; $R^{25}$ is an unsubstituted or substituted aromatic group having $C_6$-$C_{30}$ carbon atoms; $R^{29}$ is a substituted or unsubstituted $C_5$-$C_7$ cyclalky group; $R^{22}$ is selected from the group consisting of a hydrogen and a $C_1$-$C_4$ alkyl group, $R^{23}$, $R^{26}$, and $R^{28}$ are selected from the group consisting of cyclic alkyl, an unsubstituted or substituted alicyclic group having 5 to 30 carbon atoms, and $(R^{30}O)_tR^7$ group where $R^{30}$ is a $C_{2-4}$ linear or branched alkylene group and $R^7$ is selected from the group consisting of linear, branched or cyclic alkyl, an unsubstituted or substituted alicyclic group, an unsubstituted or substituted aromatic or alkyl aromatic group having 1 to 30 carbon atoms; n is an integer of about 1 to 2 and t is an integer about 1 to 4;

b) a phenolic crosslinker having Structure V

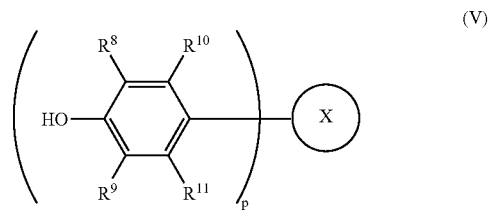

(V)

wherein p is an integer of about 2 to 6; $R^8$ is a —$CH_2OR_{12}$ group; $R^9$ is selected from the group consisting of a hydrogen atom, —$CH_2OR_{12}$ group, $C_1$-$C_5$ alkyl group, and aryl; $R^{10}$, $R^{11}$ and $R^{12}$ are each independently selected from the group consisting of a hydrogen atom, and a $C_1$-$C_5$ alkyl group; X is a di- tri-, tetra-, penta- or hex valent or arylalkyl moiety;

c) a thermal acid generator (TAG) of Structure VI

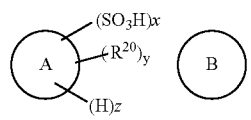

wherein A is selected from the group consisting of a phenyl and a naphthyl group, $R^{20}$ is selected from the group consisting of an alkyl or a cyclic alkyl and an unsubstituted or substituted alicyclic group having 5 to 30 carbon atoms; when A is phenyl, x is an integer of from 1 to 3, y is an integer of from 0 to 5, the sum of x and y being no greater then 6, and z is 6–x–y; when A is naphthyl, x is an integer from 1 to 3, y is an integer from 0 to 7, the sum of x and y being no greater then 8, and z is 8–x–y; b is a primary, secondary, or tertiary unsubstituted or substituted alkyl or carbocyclic or heterocyclic amine having 4 to 30 carbon atoms; and d) a solvent.

3. A thermally curable undercoat composition according to claim 2 wherein the polymer of Structure I is a polymer of Structure VII

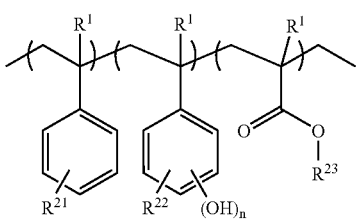

(VII)

wherein $R^1$ is selected from the group consisting of a hydrogen atom, an alkyl group having from 1 to 3 carbon atoms and a halogen atom; $R^{21}$ is an unsubstituted or substituted aromatic group having $C_6$-$C_{30}$ carbon atoms; $R^{22}$ is selected from the group consisting of a hydrogen atom and a $C_1$-$C_4$ alkyl group, $R^{23}$ is selected from the group consisting of cyclic alkyl, an unsubstituted or substituted alicyclic group having 5 to 30 carbon atoms, and $(R^{30}O)_tR^7$ group where $R^{30}$ is a $C_{2-4}$ linear or branched alkylene group and $R^7$ is selected from the group consisting of linear, branched or cyclic alkyl, an unsubstituted or substituted alicyclic group, and an unsubstituted or substituted aromatic or alkyl aromatic group having 1 to 30 carbon atoms; n is an integer of 1 to 2 and t is an integer 1 to 4.

4. A thermally curable undercoat composition according to claim 2 wherein the polymer of Structure I is a polymer of Structure VIII

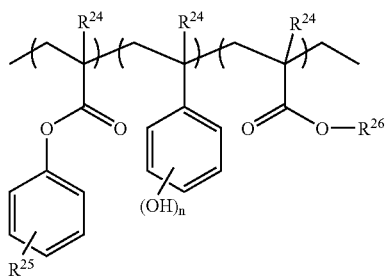

(VIII)

wherein $R^{24}$ is selected from the group consisting of a hydrogen atom and a methyl group; $R^{25}$ is an unsubstituted or substituted aromatic group having $C_6$-$C_{30}$ carbon atoms; $R^{26}$ is selected from the group consisting a cyclic alkyl or an unsubstituted or substituted alicyclic group having 5 to 30 carbon atoms and a $(R^{30}O)_t R^7$ group where $R^{30}$ is a $C_{2-4}$ linear or branched alkylene group and $R^7$ is selected from the group consisting a linear, branched or cyclic alkyl group, an unsubstituted or substituted alicyclic group, and unsubstituted or substituted aromatic or alkyl aromatic group having 1 to 30 carbon atoms and t is an integer of about 1 to 4; and n is an integer of 1 to 2.

5. A thermally curable undercoat composition comprising:
a) a polymer if Structure IX

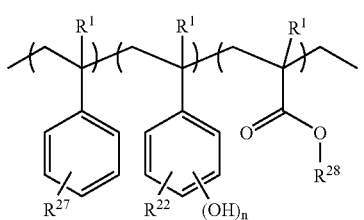

(IX)

wherein $R^1$ is selected from the group consisting of a hydrogen atom, an alkyl group having from 1 to 3 carbon atoms, and a halogen atom; $R^{22}$ is selected from the group consisting of a hydrogen atom, and a C1-C4 alkyl group; $R^{27}$ is a substituted or unsubstituted $C_5$-$C_7$ cycloalkyl; $R^{28}$ is selected from the group consisting of a cyclic alkyl, an unsubstituted or substituted alicyclic group having 5 to 30 carbon atoms and $(R^{30}O)_t R^7$ group where $R^{30}$ is a $C_{2-4}$ linear or branched alkylene group and $R^7$ is selected from the group consisting of a linear, branched or cyclic alkyl, an unsubstituted or substituted alicyclic group, and an unsubstituted or substituted aromatic or alkyl aromatic group having 1 to 30 carbon atoms and t is an integer of 1 to 4, and n is an integer of 1 to 3.

b) a phenolic crosslinker having Structure V

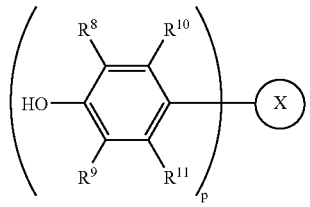

(V)

wherein p is an integer of about 2 to 6; $R^8$ is a —$CH_2OR^{12}$ group; $R^9$ is selected from the group consisting of a hydrogen atom, —$CH_2OR^{12}$ group, $C_1$-$C_5$ alkyl group, and aryl; $R^{10}$, $R^{11}$ and $R^{12}$ are each independently selected from the group consisting of a hydrogen atom, and a $C_1$-$C_5$ alkyl group; X is a di- tri-, tetra-, penta- or hexa- valent alkyl or arylalkyl moiety;

c) a thermal acid generator (TAG) of Structure VI

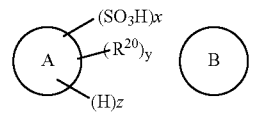

wherein A is selected from the group consisting of a phenyl and a naphthyl group, $R^{20}$ is selected from the group consisting of an alkyl or a cyclic alkyl and an unsubstituted or substituted alicyclic group having 5 to 30 carbon atoms; when A is phenyl, x is an integer of from 1 to 3, y is an integer of from 0 to 5, the sum of x and y being no greater then 6, and z is 6−x−y; when A is naphthyl, x is an integer from 1 to 3, y is an integer from 0 to 7, the sum of x and y being no greater than 8, and z is 8−x−y; B is a primary, secondary, or tertiary unsubstituted or substituted alkyl or carbocyclic or heterocyclic amine having 4 to 30 carbon atoms; and d) a solvent.

6. A thermally curable undercoat composition according to claim 2 wherein the polymer of Structure I is a polymer is Structure X

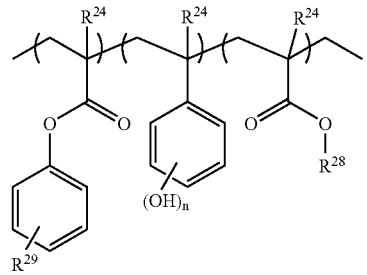

(X)

wherein $R^{24}$ is selected from the group consisting of a hydrogen atom and a methyl group; $R^{28}$ is selected from the group consisting of a cyclic alkyl, an unsubstituted or substituted alicyclic group having 5 to 30 carbon atoms and $(R^{30}O)_t R^7$ group where $R^{30}$ is a $C_{2-4}$ linear or branched alkylene group and $R^7$ is selected from the group consisting of a linear, branched or cyclic alkyl, an unsubstituted or substituted alicyclic group, and an unsubstituted or substituted aromatic or alkyl aromatic group having 1 to 30 carbon atoms and t is an integer of 1 to 4; $R^{29}$ is a substituted or unsubstituted $C_5$-$C_7$ cycloalkyl group; and n is an integer of 1 to 2.

7. A thermally curable undercoat composition according to claim 1 wherein, in repeating unit of Structure II, $R^1$ is selected from the group consisting of hydrogen and methyl; W is a single bond; and wherein when M is a $C_5$-$C_7$ cycloalkylene group and L is a single bond.

8. A thermally curable undercoat composition comprising
a) a polymer of Structure I comprising repeating units of Structure II, III, and IV

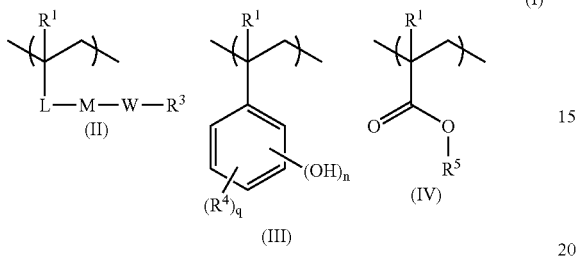

(I)

wherein each $R^1$ is independently selected from the group consisting of a hydrogen atom, an alkyl group having from 1 to 3 carbon atoms, and a halogen atom; L is selected from the group consisting of
(1) a single bond, a —COO— group, and a —CON($R^2$)— group; wherein $R^2$ is selected from the group consisting of a hydrogen atom and an alkyl group having from 1 to 3 carbon atoms; when M is a $C_{5-7}$ cycloalkylene group, and W is selected from the group consisting of a single bond, a —COO— group, —O—, —(C=O)—, and —(SO$_2$)—; and
(2) a —COO— group, and a —CON($R^2$)— group wherein $R^2$ is selected from the group consisting of a hydrogen atom and an alkyl group having from 1 to 3 carbon atoms, when M is an arylene group having from 6 to 18 carbon atoms, W is selected from the group consisting of a —COO— group, —O—, —(C=O)—, and —(SO$^2$)—;

$R^3$ is selected from the group consisting of a cyclopentyl, cyclohexyl, adamantyl, bicycle[2.2.1]heptyl, tricycle [5.2.1.0$^{2,6}$]decyl, phenyl and naphthyl; n is an integer from 1 to 3, q is an integer from 0 to 3, the sum of n and q being no greater then 5; $R^4$ is selected from the group consisting of a linear or branched or cyclic $C_1$-$C_{10}$ alkyl and a halogen group; $R^5$ is selected from the group consisting of a linear, branched or cyclic alkyl and an unsubstituted or substituted alicyclic group, having 5 to 30 carbon atoms, and a $(R^6O)_tR^7$ group where $R^6$ is a $C_{1-10}$ linear or branched alkylene group and $R^7$ is selected from the group consisting of a linear, branched or cyclic alkyl, an unsubstituted or substituted alicyclic group and an unsubstituted or substituted aromatic or alkyl aromatic group having 1 to 30 carbon atoms and t is an integer from 1 to 4;

b) a phenolic crosslinker having Structure V

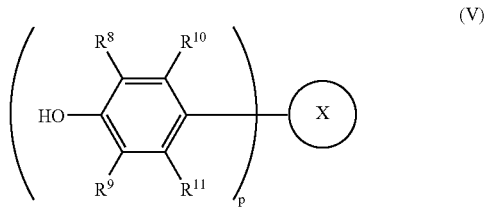

(V)

wherein p is an integer of about 2 to 6; $R^8$ is a —CH$_2$OR$^{12}$ group; $R^9$ is selected from the group consisting of a hydrogen atom, —CH$_2$OR$^{12}$ group, $C_1$-$C_5$ alkyl group, and aryl; $R^{10}$, $R^{11}$ and $R^{12}$ are each independently selected from the group consisting of a hydrogen atom, and a $C_1$-$C_5$ alkyl group; X is a di- tri-, tetra-, penta- or hexa-valent alkyl or arylalkyl moiety;

c) a thermal acid generator (TAG) of Structure VI

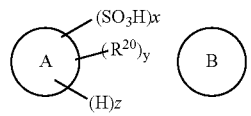

wherein A is selected from the group consisting of a phenyl and a naphthyl group, $R^{20}$ is selected from the group consisting of an alkyl or a cyclic alkyl and an unsubstituted or substituted alicyclic group having 5 to 30 carbon atoms; when A is phenyl, x is an integer of from 1 to 3, y is an integer of from 0 to 5, the sum of x and y being no greater than 6, and z is 6−x−y; when A is naphthyl, x is an integer from 1 to 3, y is an integer from 0 to 7, the sum of x and y being no greater than 8, and z is 8−x−y; B is a primary, secondary, or tertiary unsubstituted or substituted alkyl or carbocyclic or heterocyclic amine having 4 to 30 carbon atoms; and d) a solvent.

9. A thermally curable undercoat composition according to claim 1 wherein, in the repeating unit of Structure III, wherein $R^1$ is selected from the group consisting of hydrogen and methyl; $R^4$ is selected from the group consisting of a hydrogen atom, a halogen group and a $C_1$-$C_4$ linear or branched group.

10. A thermally curable undercoat composition according to claim 1 wherein, in repeating unit of Structure II, $R^1$ is selected from the group consisting of hydrogen and methyl; W is a single bond; and wherein when M is a $C_5$-$C_7$ cycloalkylene group L is selected from the group consisting of a single bond and a —COO— group; and $R^3$ is selected from the group consisting of cyclopentyl, cyclohexyl, adamantyl, bicycle[2.2.1.]heptyl, tricycle[5.2.1.0$^{2,6}$]decyl, phenyl and naphthyl; in the repeating unit of Structure III, wherein $R^1$ is selected from the group consisting of hydrogen and methyl; $R^4$ is selected from the group consisting of a hydrogen atom, a halogen group and a $C_1$-$C_4$ linear or branched alkyl group; and, in the repeating unit of Structure IV, wherein $R^1$ is selected from the group consisting of a cyclohexyl, bicysle [2.2.1]heptyl, adamantly, adamantylmethyl, tricycle [5.2.1.02,6]decanemethyl, and ethoxydicyclopentenyl.

11. A process for forming a pattern on a substrate comprising the following process steps:
a. providing a substrate,
b. coating in a first coating step said substrate with a thermally curable undercoat composition of claim 1,
c. curing said undercoat composition,
d. coating in a second coating step a photoresist over the undercoat to produce a bilayer photoresist stack,
e. exposing the bilayer photoresist stack to provide a photosensitive composition portion of the bilayer photoresist stack,
f. developing the photosensitive composition portion of the bilayer photoresist stack making a portion of the underlying undercoat visible,
g. rinsing the bilayer photoresist stack, and
h. etching the visible undercoat in an oxidizing plasma to produce a bilayer relief image.

12. A process for forming a pattern on a substrate comprising the following process steps:
   a. providing a substrate,
   b. coating in a first coating step said substrate with a thermally curable undercoat composition of claim 3,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

13. A process for forming a pattern on a substrate comprising the following process steps:
   a. providing a substrate,
   b. coating in a first coating step said substrate with a thermally curable undercoat composition of claim 4,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

14. A process for forming a pattern on a substrate comprising the following process steps:
   a. providing a substrate,
   b. coating in a first coating step said substrate with a thermally curable undercoat composition of claim 5,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

15. A process for forming a pattern on a substrate comprising the following process steps:
   a. providing a substrate,
   b. coating in a first coating step said substrate with a thermally curable undercoat composition of claim 6,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

16. A process for forming a pattern on a substrate comprising the following process steps:
   a. providing a substrate,
   b. coating in a first coating step said substrate with a thermally curable undercoat composition of claim 7,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

17. A process for forming a pattern on a substrate comprising the following process steps:
   a. providing a substrate,
   b. coating in a first coating step said substrate with a thermally curable undercoat composition of claim 8,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

18. A process for forming a pattern on a substrate comprising the following process steps:
   a. providing a substrate,
   b. coating in a first coating step said substrate with a thermally curable undercoat composition of claim 9,
   c. curing said undercoat composition,
   d. coating in a second coating step a photoresist over the undercoat to produce a bilayer photoresist stack,
   e. exposing the bilayer photoresist stack to provide a photosensitive composition portion of the bilayer photoresist stack,
   f. developing the photosensitive composition portion of the bilayer photoresist stack making a portion of the underlying undercoat visible,
   g. rinsing the bilayer photoresist stack, and
   h. etching the visible undercoat in an oxidizing plasma to produce a bilayer relief image.

19. A process for forming a pattern on a substrate comprising the following process steps:
   a. providing a substrate,
   b. coating in a first coating step said substrate with a thermally curable undercoat composition of claim 10,
   c. curing said undercoat composition,
   d. coating in a second coating step a photoresist over the undercoat to produce a bilayer photoresist stack, e. exposing the bilayer photoresist stack to provide a photosensitive composition portion of the bilayer photoresist stack, f. developing the photosensitive composition portion of the bilayer photoresist stack making a portion of the underlying undercoat visible, g. rinsing the bilayer photoresist stack, and h. etching the visible undercoat in an oxidizing plasma to produce a bilayer relief image.

20. A bilayer relief image produced by the process of claim 11.

21. A coated substrate comprising a semiconductor substrate coated by the composition of claim 1 wherein the composition of claim 1 is further coated with a photoresist.

22. A process for forming a pattern on a substrate comprising the following process steps:

a. providing a substrate, b. coating in a first coating step said substrate with a thermally curable undercoat composition of claim 2, c. curing said undercoat composition, d. coating in a second coating step a photoresist over the undercoat to produce a bilayer photoresist stack, e. exposing the bilayer photoresist stack to provide a photosensitive composition portion of the bilayer photoresist stack, f. developing the photosensitive composition portion of the bilayer photoresist stack making a portion of the underlying undercoat visible, g. rinsing the bilayer photoresist stack, and h. etching the visible undercoat in an oxidizing plasma to produce a bilayer relief image.

23. A bilayer relief image produced by the process of claim 22.

24. A coated substrate comprising a semiconductor substrate coated by the composition of claim 2 wherein the composition of claim 1 is further coated with photoresist.

* * * * *